United States Patent
Hida et al.

(10) Patent No.: US 9,123,893 B2
(45) Date of Patent: Sep. 1, 2015

(54) CARBON NANO-TUBE DISPERSANT

(75) Inventors: Masahiro Hida, Funabashi (JP); Daigo Saito, Funabashi (JP); Tatsuya Hatanaka, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 408 days.

(21) Appl. No.: 13/511,884

(22) PCT Filed: Nov. 25, 2010

(86) PCT No.: PCT/JP2010/070973
§ 371 (c)(1),
(2), (4) Date: May 24, 2012

(87) PCT Pub. No.: WO2011/065395
PCT Pub. Date: Jun. 3, 2011

(65) Prior Publication Data
US 2012/0268840 A1  Oct. 25, 2012

(30) Foreign Application Priority Data
Nov. 25, 2009  (JP) .................. 2009-267815

(51) Int. Cl.
| | | |
|---|---|---|
| C08K 3/04 | (2006.01) | |
| H01L 51/00 | (2006.01) | |
| B01F 17/00 | (2006.01) | |
| B82Y 10/00 | (2011.01) | |
| B82Y 20/00 | (2011.01) | |
| B82Y 30/00 | (2011.01) | |

(Continued)

(52) U.S. Cl.
CPC .......... *H01L 51/0007* (2013.01); *B01F 17/005* (2013.01); *B82Y 10/00* (2013.01); *B82Y 20/00* (2013.01); *B82Y 30/00* (2013.01); *B82Y 40/00* (2013.01); *C01B 31/0273* (2013.01); *C08G 10/00* (2013.01); *C08G 10/02* (2013.01); *C08G 73/026* (2013.01); *C08L 61/00* (2013.01); *C08L 79/02* (2013.01); *C09D 5/24* (2013.01); *C09D 7/1291* (2013.01); *G02B 1/105* (2013.01); *H01L 51/0035* (2013.01); *H01L 51/0048* (2013.01); *G02B 2207/101* (2013.01)

(58) Field of Classification Search
CPC ....................................................... C08K 3/04
USPC ................................................. 524/495, 496
See application file for complete search history.

(56) References Cited

U.S. PATENT DOCUMENTS 5,681,664 A  10/1997 Tamano et al.
6,576,341 B1  6/2003 Davey et al.

(Continued)

FOREIGN PATENT DOCUMENTS

JP  8-100038 A   4/1996
JP  10-302963 A  11/1998

(Continued)

OTHER PUBLICATIONS

Shinohara et al., "Individual Solubilization of Single-Walled Carbon Nanotube Using Hyperbranched Polymers and Their Properties", Polymer Preprints, Japan, vol. 56, No. 1, 2007, pp. 1463.

(Continued)

*Primary Examiner* — Edward Cain
(74) *Attorney, Agent, or Firm* — Birch, Stewart, Kolasch & Birch, LLP

(57) ABSTRACT

Disclosed is a carbon nano-tube dispersant comprising a highly branched polymer having a repeating unit represented by, for example, formula (12) or (13), wherein the highly branched polymer is produced by the polycondensation of a triarylamine compound and an aldehyde compound and/or a ketone compound in the presence of an acid catalyst. The carbon nano-tube dispersant enables the dispersion of CNTs in a medium such as an organic solvent until the CNTs are so decomposed as to have an individual size.

(12)

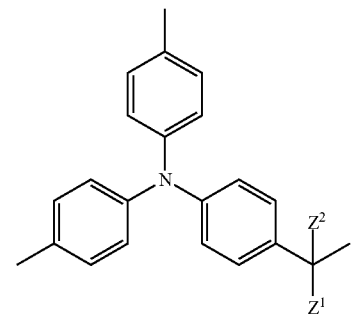

(13)

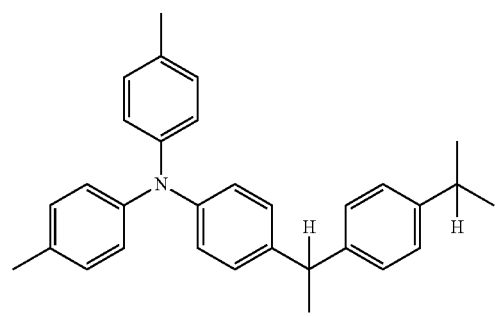

(In the formula, Z1 and Z2 independently represent a hydrogen atom, a phenyl group, a thienyl group, or the like.)

23 Claims, 5 Drawing Sheets

(51) Int. Cl.
*B82Y 40/00* (2011.01)
*C01B 31/02* (2006.01)
*G02B 1/10* (2015.01)
*C08G 10/00* (2006.01)
*C08G 10/02* (2006.01)
*C08G 73/02* (2006.01)
*C08L 61/00* (2006.01)
*C08L 79/02* (2006.01)
*C09D 5/24* (2006.01)
*C09D 7/12* (2006.01)

(56) References Cited

U.S. PATENT DOCUMENTS

| 7,682,590 | B2 | 3/2010 | Sakakibara et al. |
| 2010/0090174 | A1 | 4/2010 | Weber et al. |
| 2010/0133483 | A1 | 6/2010 | Nakashima et al. |
| 2011/0021687 | A1 | 1/2011 | Jain et al. |

FOREIGN PATENT DOCUMENTS

| JP | 2000-44216 A | | 2/2000 |
| JP | 2001-255566 | * | 9/2001 |
| JP | 2001-255566 A | | 9/2001 |
| JP | 2004-119393 A | | 4/2004 |
| JP | 2005-162877 A | | 6/2005 |
| JP | 2008-24522 A | | 2/2008 |
| JP | 2010-163570 A | | 7/2010 |
| WO | WO 2008/074687 A2 | | 6/2008 |
| WO | WO 2008/139839 A | | 11/2008 |
| WO | WO 2009/115536 A1 | | 9/2009 |
| WO | WO 2010/147155 A1 | | 12/2010 |

OTHER PUBLICATIONS

Extended European Search Report, dated Oct. 15, 2013, for Patent Application No. 10833241.2.

Japanese Office Action for Japanese Application No. 2011-543280, dated Sep. 24, 2014.

Ogino et al., "Synthesis and Nanostructure Control of Semiconducting Polymers," Journal of Synthetic Organic Chemistry, vol. 66, No. 9, 2008, pp. 869-879, with an English language abstract.

Son et al., "Condensation polymerization of triphenylamine with carbonyl compounds," Macromolecular Chemistry and Physics, vol. 200, No. 1, 1999, pp. 65-70.

* cited by examiner

CARBON NANO-TUBE DISPERSANT

TECHNICAL FIELD

This invention relates to a carbon nano-tube dispersant and more particularly, to a carbon nano-tube dispersant made of a highly branched polymer containing a triarylamine structure as a branching point and also to a carbon nano-tube-containing composition including the above dispersant.

BACKGROUND ART

Carbon nano-tubes (which may sometimes be hereinafter abbreviated as CNT) have been investigated as a potential material for nanotechnology with respect to the possibility of applications in a wide range of fields. For the applications thereof, there can be broadly classified into a method wherein single CNT itself is used as a transistor, a microscopic probe or the like, and a method wherein a multitude of CNTs are used collectively as a bulk such as an electron emission electrode, a fuel cell electrode or a conductive composite dispersing CNTs.

Where a single CNT is used, CNTs are added to a solvent and irradiated with a ultrasonic wave, followed by collecting CNTs dispersed individually such as by electrophoresis or the like.

On the other hand, with a conductive composite used in the form of a bulk, it is necessary to well disperse them in a polymer serving as a matrix material.

However, CNTs have a problem in that they are generally difficult to disperse. In ordinary composites, the composite is used while dispersing CNTs incompletely. Thus, it cannot be said that the performance of the CNTs is satisfactorily demonstrated.

Furthermore, this problem leads to a difficulty in various applications of CNTs. To avoid this, there have been extensively studied a method of improving dispersibility of CNTs such as by surface reforming, surface chemical modification or the like.

As such a method of dispersing CNTs, there has been proposed a method (see, for example, Patent Document 1) of depositing, on the CNT surface, poly((m-phenylenevinylene)-co-(dioctoxy-p-phenylenevinylene)) having a coily structure.

In this method, it is possible to discretely disperse CNTs in an organic solvent, and the state of a single CNT deposited with a polymer is shown. Nevertheless, after once dispersed to some extent, coagulation takes place and thus, CNTs are collected as a precipitate, unlike the case of storage where CNTs are kept dispersed over a long time.

In order to solve the above problems, there have been proposed a method of dispersing CNTs in an amide-based polar organic solvent with the aid of polyvinylpyrrolidone (see, for example, Patent Document 2) and a method of dispersing in an alcoholic organic solvent (see, for example, Patent Document 3).

However, the polymer used as a dispersant is characterized in that it is made of a linear polymer, and knowledge concerning highly branched polymers has never been made clear.

On the other hand, a method wherein attention is paid to a highly branched polymer for use as a dispersant of CNTs has been proposed (see, for example, Patent Document 4). The highly branched polymer is of the type that has branches on the skeleton as with the case of a star polymer, or a dendrimer and a hyperbranched polymer, which are classified into a dendritic polymer.

These highly branched polymers not only show such as specific shape as to have a relatively loose internal space and a particulate behavior because of the positive introduction of branches, unlike ordinary polymers that are generally in the form of string, but also have a number of terminal ends that can be modified by introduction of a variety of functional groups. When utilizing these features, there is some possibility of dispersing CNTs to a higher degree as compared with linear polymers.

However, in the technique of Patent Document 4 wherein the above-mentioned highly branched polymer is used as a dispersant, thermal treatment is necessary aside from mechanical treatment so as to keep CNTs in discretely dispersed state over a long time, and the dispersibility of CNTs has not been so high.

Further, in the technique of this Patent Document 4, the yield of preparing the dispersant is low, and it is necessary to use a large amount of a metal catalyst used as a coupling agent for improving the yield, so that there is concern that the metallic component is left in the resulting highly branched polymer, thus leading to concern that limitation is placed on applications in the use of the composite along with CNTs.

PRIOR ART DOCUMENTS

Patent Documents

Patent Document 1: JP-A 2000-44216
Patent Document 2: JP-A 2005-162877
Patent Document 3: JP-A 2008-24522
Patent Document 4: WO 2008/139839

SUMMARY OF THE INVENTION

Problems to be Solved by the Invention

The present invention has been made in consideration of such above mentioned circumstances and has an object to provide a carbon nano-tube dispersant capable of dispersing CNTs in a medium such as an organic solvent to an extent of single size thereof.

Means for Solving the Problems

The present inventors have made intensive studies so as to achieve the above object and, as a result, found that a highly branched polymer having a triarylamine structure as a branching point is excellent in dispersibility of CNTs and when this highly branched polymer is used as a CNT dispersant, (at least a part of) CNTs can be discretely dispersed to its single particle size without an additional heat treatment, thereby accomplishing the invention.

More particularly, the invention provides:
1. A carbon nano-tube dispersant, characterized by including a highly branched polymer obtained by condensation polymerization of a triarylamine compound, and an aldehyde compound and/or a ketone compound in the presence of an acid catalyst;
2. The carbon nano-tube dispersant of 1, wherein a weight average molecular weight, measured by gel permeation chromatography and calculated as polystyrene, of the highly branched polymer is at 1,000 to 2,000,000;
3. The carbon nano-tube dispersant of 2, wherein the highly branched polymer has repeating units represented by the formula (1) or (2)

[Chemical Formula 1]

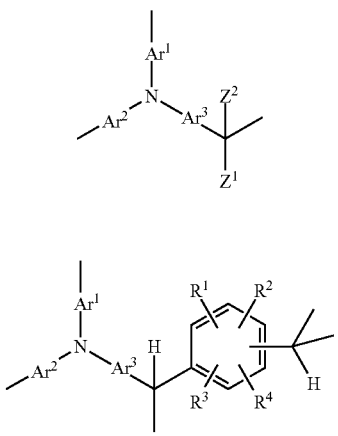

(1)

(2)

[in the formula (1) or (2), $Ar^1$ to $Ar^2$ respectively independently represent any of divalent organic groups represented by the formulas (3) to (7), $Z^1$ and $Z^2$ respectively independently represent a hydrogen atom, an alkyl group that may have a branched structure having 1 to 5 carbon atoms, or any of monovalent organic groups represented by the formulas (8) to (11) (provided that $Z^1$ and $Z^2$ do not stand for the above-defined alkyl group at the same time), and in the formula (2), $R^1$ to $R^4$ respectively independently represent a hydrogen atom, a halogen atom, an alkyl group that may have a branched structure having 1 to 5 carbon atoms or an alkoxy group that may have a branched structure having 1 to 5 carbon atoms,

[Chemical Formula 2]

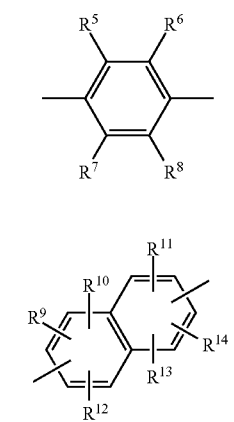

(3)

(4)

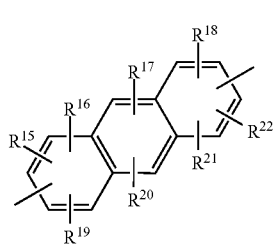

(5)

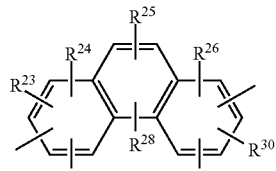

(6)

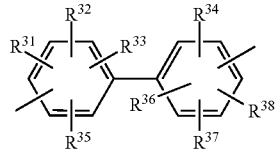

(7)

(wherein $R^5$ to $R^{38}$ respectively independently represent a hydrogen atom, a halogen atom, an alkyl group that may have a branched structure having 1 to 5 carbon atoms, or an alkoxy group that may have a branched structure having 1 to 5 carbon atoms)

[Chemical Formula 3]

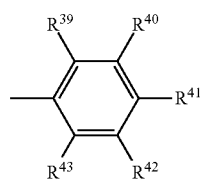

(8)

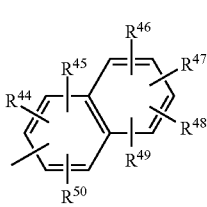

(9)

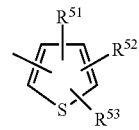

(10)

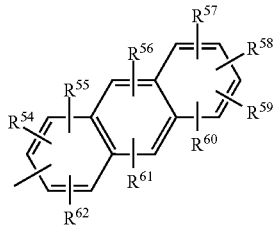

(11)

{wherein $R^{39}$ to $R^{62}$ respectively independently represent a hydrogen atom, a halogen atom, an alkyl group that may have a branched structure having 1 to 5 carbon atoms, a haloalkyl group that may have a branched structure having 1 to 5 carbon atoms, a phenyl group, $OR^{63}$, $COR^{63}$, $COOR^{63}$ or $NR^{63}R^{64}$ (wherein $R^{63}$ and $R^{64}$ respectively independently represent a hydrogen atom, an alkyl group that may have a branched structure having 1 to 5 carbon atoms, a haloalkyl group that may have a branched structure having 1 to 5 carbon atoms, or a phenyl group)}];

4. The carbon nano-tube dispersant of 3, wherein the repeating units are represented by the formula (12)

[Chemical Formula 4]

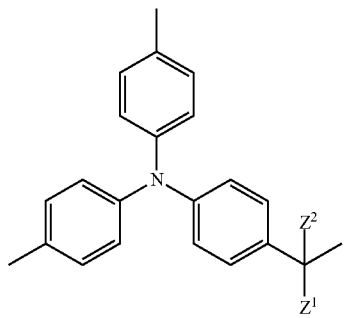

(12)

(wherein $Z^1$ and $Z^2$, respectively, have the same meanings as defined above);

5. The carbon nano-tube dispersant of 3 or 4, wherein $Z^2$ is a hydrogen atom;
6. The carbon nano-tube dispersant of 5, wherein $Z^1$ is a hydrogen atom, a thienyl group or a monovalent organic group represented by the formula (8')

[Chemical Formula 5]

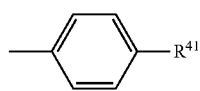

(8')

{wherein $R^{41}$ represents a hydrogen atom, a halogen atom, an alkyl group that may have a branched structure having 1 to 5 carbon atoms, a haloalkyl group that may have a branched structure having 1 to 5 carbon atoms, a phenyl group, $OR^{63}$ or $NR^{63}R^{64}$ (wherein $R^{63}$ and $R^{64}$, respectively, have the same meanings as defined above)};

7. The carbon nano-tube dispersant of 3, wherein the repeating units are represented by the following formula (13)

[Chemical Formula 6]

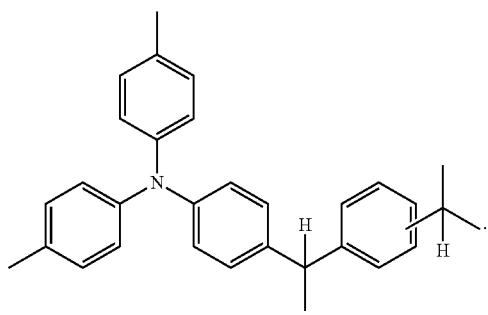

(13)

8. A composition including the carbon nano-tube dispersant of any of 1 to 7, and carbon nano-tubes;
9. The composition of 8, wherein the carbon nano-tube dispersant is adhered to the surface of the carbon nano-tubes to form composites;
10. The composition of 8 or 9, further including an organic solvent;
11. The composition of 10, wherein the carbon nano-tubes are discretely dispersed in the organic solvent;
12. The composition of 10, wherein the composite is discretely dispersed in the organic solvent;
13. The composition of any of 8 to 12, wherein the carbon nano-tube is at least one selected from a single-walled carbon nano-tube, a double-walled carbon nano-tube and a multi-walled carbon nano-tube;
14. The composition of any of 10 to 13, further including a cross-linking agent soluble in the organic solvent;
15. The composition of 14, further including an acid and/or an acid generator;
16. A thin film obtained from the composition of any of 8 to 15;
17. A cured film obtained by subjecting the thin film obtained from the composition of 14 or 15 to thermal treatment;
18. The composition of 8, further including a resin serving as a matrix;
19. The composition of 18, wherein the resin serving as the matrix is a thermoplastic resin;
20. The composition of 18 or 19, wherein the carbon nano-tube is at least one selected from a single-walled carbon nano-tube, a double-walled carbon nano-tube and a multi-walled carbon nano-tube;
21. A method for preparing a composition, characterized by including the steps of mixing the carbon nano-tube dispersant of any of 1 to 7, carbon nano-tubes and an organic solvent to prepare a mixture, and subjecting the mixture to mechanical treatment;
22. The preparing method of 21, characterized by including the steps of adding the carbon nano-tubes to a solution dissolving the carbon nano-tube dispersant in the organic solvent to prepare the mixture, and subjecting the mixture to mechanical treatment;
23. A method for preparing a composition, characterized by including the step of melt-kneading the carbon nano-tube dispersant of any of 1 to 7, carbon nano-tubes and a thermoplastic resin to provide a composite;
24. A highly branched polymer, characterized by including repeating units represented by the formula (1) or (2)

[Chemical Formula 7]

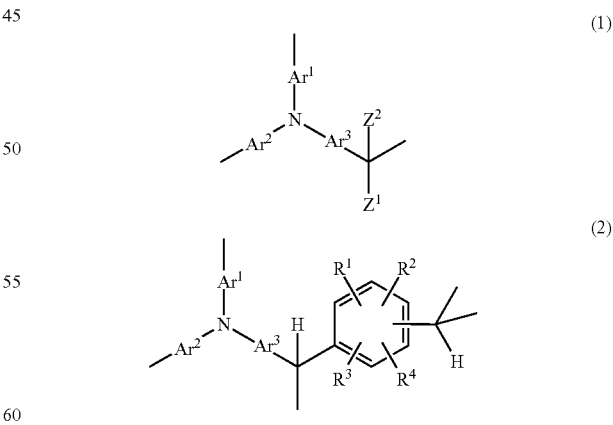

[in the formulas (1) and (2), $Ar^1$ to $Ar^2$ respectively independently represent a divalent organic group represented by any of the formulas (3) to (7), $Z^1$ and $Z^2$ respectively independently represent a hydrogen atom, an alkyl group that may have a branched structure having 1 to 5 carbon atoms, or a monovalent organic group represented by any of the formulas (8) to (11) (provided that either of $Z^1$ or $Z^2$ is a monovalent organic group represented by any of the formulas (8) to (11)), and in the formula (2), $R^1$ to $R^4$ respectively independently represent a hydrogen atom, a halogen atom, an alkyl group that may have a branched structure having 1 to 5 carbon atoms, or an alkoxy group that may have a branched structure having 1 to 5 carbon atoms,

[Chemical Formula 8]

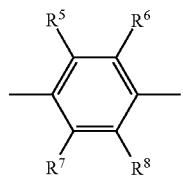
(3)

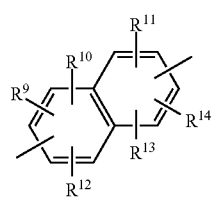
(4)

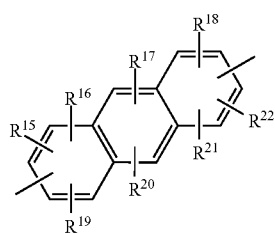
(5)

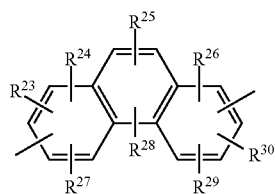
(6)

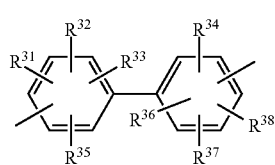
(7)

(wherein $R^5$ to $R^{38}$ respectively independently represent a hydrogen atom, a halogen atom, an alkyl group that may have a branched structure having 1 to 5 carbon atoms, or an alkoxy group that may have a branched structure having 1 to 5 carbon atoms)

[Chemical Formula 9]

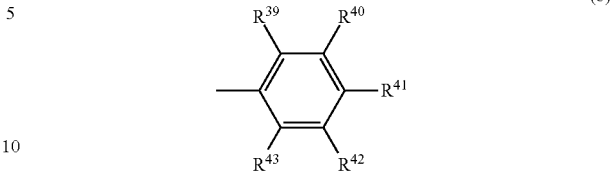
(8)

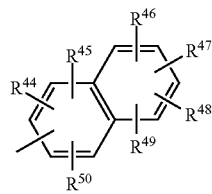
(9)

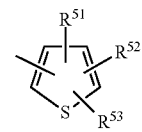
(10)

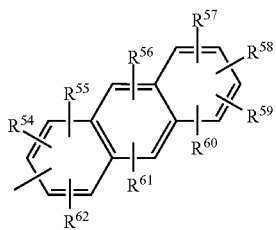
(11)

{wherein $R^{39}$ to $R^{62}$ respectively independently represent a hydrogen atom (provided that $R^{39}$ to $R^{43}$ do not represent a hydrogen atom at the same time), a halogen atom, an alkyl group that may have a branched structure having 1 to 5 carbon atoms, a haloalkyl group that may have a branched structure having 1 to 5 carbon atoms, a phenyl group, $OR^{63}$, $COR^{63}$, $COOR^{63}$ or $NR^{63}R^{64}$ (in these formulas, $R^{63}$ and $R^{64}$ respectively independently represent a hydrogen atom, an alkyl group that may have a branched structure having 1 to 5 carbon atoms, a haloalkyl group that may have a branched structure having 1 to 5 carbon atoms, or a phenyl group provided that in the formula (8), where $R^{41}$ is an $NR^{63}R^{64}$ group and the others are a hydrogen atom, $R^{63}$ and $R^{64}$ do not represent a phenyl group at the same time)}];

25. The highly branched polymer of 24, having a weight average molecular weight measured by gel permeation chromatography and calculated as polystyrene of 1,000 to 2,000,000;

26. The highly branched polymer of 24 or 25, wherein the repeating units are represented by the formula (12)

[Chemical Formula 10]

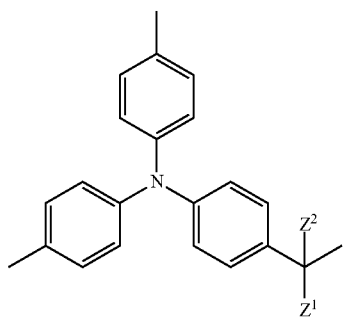

(12)

[wherein $Z^1$ and $Z^2$ have the same meanings as defined above, respectively];

27. The highly branched polymer of any of 24 to 26, wherein $Z^2$ is a hydrogen atom;
28. The highly branched polymer of 27, wherein $Z^1$ is a thienyl group or a monovalent organic group represented by the formula (8')

[Chemical Formula 11]

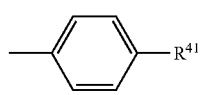

(8')

{wherein $R^{41}$ represents a halogen atom, an alkyl group that may have a branched structure having 1 to 5 carbon atoms, a haloalkyl group that may have a branched structure having 1 to 5 carbon atoms, a phenyl group, $OR^{63}$ or $NR^{63}R^{64}$ (in these formulas, $R^{63}$ and $R^{64}$ have the same meanings as defined before provided that $R^{63}$ and $R^{64}$ do not represent a phenyl group at the same time)};
29. The highly branched polymer of 24 or 25, wherein the repeating units are represented by the formula (13)

[Chemical Formula 12]

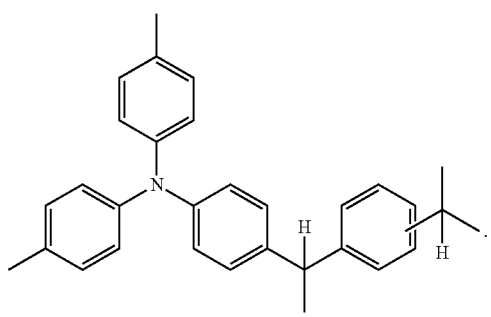

(13)

30. A film-forming composition including the highly branched polymer of any of 24 to 29;
31. A film including the highly branched polymer of any of 24 to 29;
32. An electronic device including a substrate, and the film of 31 formed on the substrate;
33. An optical constituent material including a substrate, and the film of 31 formed on the substrate;
34. A solid-state image sensing device made of a charge coupling device or complementary metal oxide semiconductor, which including at least a layer of the film of 31; and
35. A solid-state image sensing device including the film of 31 as a flattening layer formed on a color filter.

Advantageous Effect of the Invention

The dispersant of the invention is made of a highly branched polymer having a triarylamine structure as branching point, so that it is excellent in dispersibility of CNTs and is able to discretely disperse CNTs to a single size thereof without a thermal treatment.

Accordingly, when using the dispersant of the invention, at least a part of CNTs can be isolated to an extent of a single size (diameter: 0.4 to 100 nm) and can be stably (without coagulation) dispersed in an organic solvent in a state of so-called "discrete dispersion." It will be noted that the term "discrete dispersion" means a state where CNTs exist as dispersed in a medium individually in an unbound state without forming bulks, bundles or ropes owing to the mutual coagulation force of the CNTs.

Additionally, CNTs can be dispersed only by subjecting a solution containing the dispersant, CNTs and an organic solvent to mechanical treatment such as ultrasonic treatment. For the dispersion, an additional step such as of thermal treatment can be omitted and the treating time can be shortened.

Accordingly, when using the CNT dispersant of the invention, there can be readily obtained a CNT-containing composition wherein (at least a part of) CNTs are dispersed in a state of discrete dispersion.

The CNT-containing composition obtained in the invention allows easy thin film formation only by coating on a substrate, and the resulting thin film exhibits high electric conductivity. In this composition, the amount of CNTs can be readily controlled depending on the use thereof and can thus be appropriately usable in a wide range of applications as various types of semiconductor materials, conductive materials and the like.

The highly branched polymer of the invention is able to provide a film showing a high refractive index, high transparency and high heat resistance.

This film can be favorably utilized as one of constituent materials used to make electronic devices including a liquid crystal display, an organic electroluminescent (EL) display, a light-emitting diode (LED) device, a solid-state image sensing device, an organic thin film solar cell, a dye-sensitized solar cell, an organic thin film transistor (TFT) and the like.

Especially, the film can be conveniently utilized as a constituent material, requiring a high refractive index, of a solid-state image sensing device including a buried film and a flattening film on a photodiode, a flattening film formed on or under a color filter, a microlens, or a flattening film and a conformal film on a microlens.

EMBODIMENT FOR CARRYING OUT THE INVENTION

Figure 1:
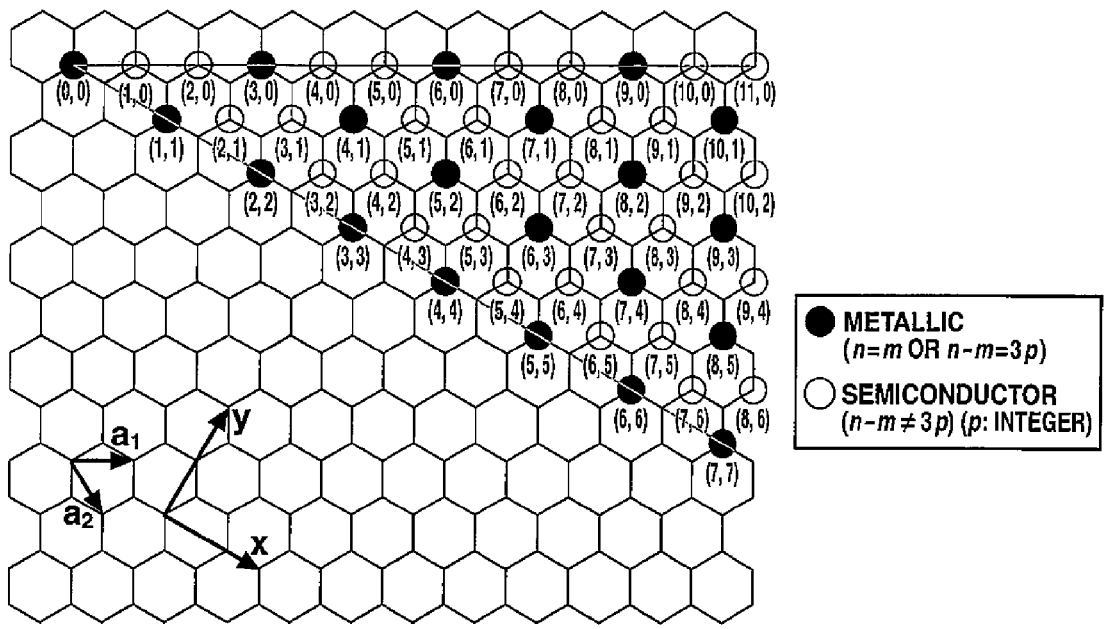
FIG. 1 is a figure showing a chiral vector of carbon nanotube.

The invention is now described in more detail.

The CNT dispersant of the invention is made of a highly branched polymer containing a triarylamine structure as a branching point and more particularly, is made of a highly branched polymer obtained by condensation polymerization of triarylamines and aldehydes and/or ketones under acidic conditions.

It is considered that this highly branched polymer shows high affinity for the conjugated structure of CNT through the π-π interaction derived from the aromatic ring of the triarylamine structure and is thus expected to exhibit high dispersibility of CNTs. The polymer has features in that when appropriately changing the combination and conditions of the triarylamines and the comonomers selected from aldehydes and/or ketones, it becomes possible to introduce a variety of skeletal designs and functional groups, control the molecular weight and its distribution and impart functionality. Moreover, the highly branched polymer has a branched structure and thus has high solubility as would not be expected with linear ones, is excellent in thermal stability and shows excellent hole transportability, thus being expected for application as an organic EL material.

Although the average molecular weight of the highly branched polymer is not critical, the weight average molecular weight is preferably at 1,000 to 2,000,000. If the weight average molecular weight of the polymer is less than 1,000, the dispersibility of CNT may lower considerably, or there is concern that the dispersibility is not shown. On the other hand, when the weight average molecular weight exceeds 2,000,000, there may be concern that handling in dispersion treatment becomes very difficult. A highly branched polymer having a weight average molecular weight of 2,000 to 1,000,000 is more preferred.

It will be noted that the weight average molecular weight used in the invention is a value (calculated as polystyrene) measured according to gel permeation chromatography.

The highly branched polymer of the invention is not critical in type and is preferably one, which has a triarylamine skeleton as a branching point and is represented by the following formula (1) or (2).

[Chemical Formula 13]

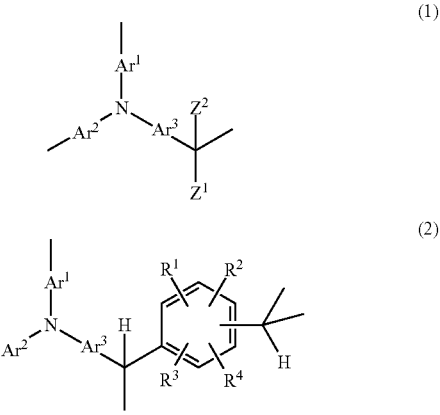

In the formulas (1) and (2), $Ar^1$ to $Ar^3$ respectively independently represent a divalent organic group represented by any of the formulas (3) to (7), of which a substituted or unsubstituted phenylene group represented by the formula (3) is preferred and a phenylene group of the formula wherein $R^5$ to $R^8$ are all a hydrogen atom is more preferred,

[Chemical Formula 14]

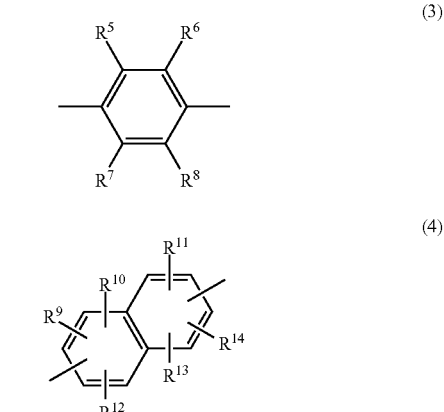
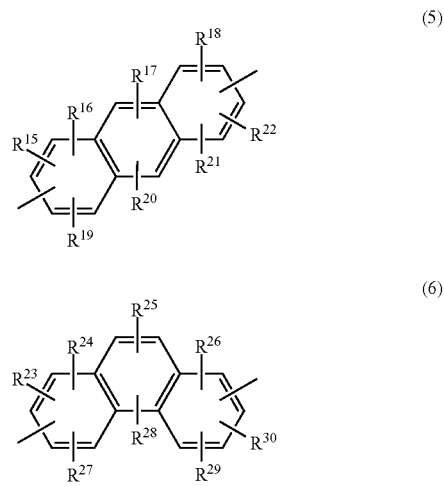
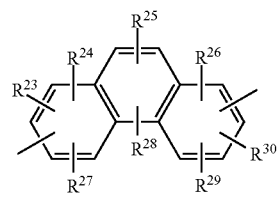

-continued

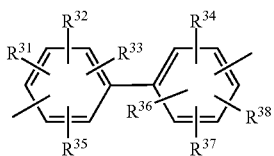

(7)

In the formulas (2) to (7), $R^1$ to $R^{38}$ respectively independently represent a hydrogen atom, a halogen atom, an alkyl group that may have a branched structure having 1 to 5 carbon atoms, or an alkoxy group that may have a branched structure having 1 to 5 carbon atoms.

The halogen atom includes a fluorine atom, a chlorine atom, a bromine atom or an iodine atom.

The alkyl group having a branched structure having 1 to 5 carbon atoms includes a methyl group, an ethyl group, an n-propyl group, an isopropyl group, an n-butyl group, a sec-butyl group, a tert-butyl group, or an n-pentyl group or the like.

The alkoxy group that may have a branched structure having 1 to 5 carbon atoms includes a methoxy group, an ethoxy group, an n-propoxy group, an isopropoxy group, an n-butoxy group, a sec-butoxy group, a tert-butoxy group, an n-pentoxy group or the like.

In the formulas (1) and (2), $Z^1$ and $Z^2$ respectively independently represent a hydrogen atom, an alkyl group that may have a branched structure having 1 to 5 carbon atoms, or a monovalent organic group represented by any of the formulas (8) to (11) (provided that $Z^1$ and $Z^2$ do not represent the alkyl group at the same time). Preferably, $Z^1$ and $Z^2$ respectively independently represent a hydrogen atom, a 2- or 3-thienyl group or a group represented by the formula (8'). More preferably, either of $Z^1$ or $Z^2$ is a hydrogen atom, and the other represents a hydrogen atom, a 2- or 3-thienyl group, or a group represented by the following formula (8'), especially, a 4-biphenyl group wherein $R^{41}$ is a phenyl group and a 4-methoxyphenyl group wherein $R^{41}$ is a methoxy group.

It will be noted that as the alkyl group that may have a branched structure having 1 to 5 carbon atoms, mention is made of those exemplified as mentioned above.

[Chemical Formula 15]

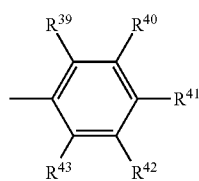

(8)

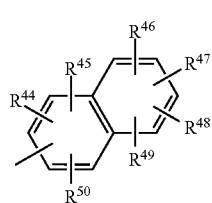

(9)

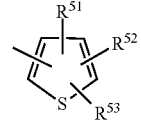

(10)

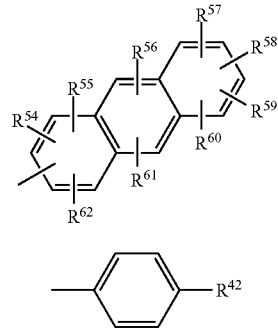

(11)

(8')

In the formulas (8) to (11) and (8'), $R^{39}$ to $R^{62}$ respectively independently represent a hydrogen atom, a halogen atom, an alkyl group that may have a branched structure having 1 to 5 carbon atoms, a haloalkyl group that may have a branched structure having 1 to 5 carbon atoms, a phenyl group, $OR^{63}$, $COR^{63}$, $COOR^{63}$ or $NR^{63}R^{64}$ (wherein $R^{63}$ and $R^{64}$ respectively independently represent a hydrogen atom, an alkyl group that may have a branched structure having 1 to 5 carbon atoms, a haloalkyl group that may have a branched structure having 1 to 5 carbon atoms, or a phenyl group).

The haloalkyl group that may have a branched structure having 1 to 5 carbon atoms includes a difluoromethyl group, a trifluoromethyl group, a bromodifluoromethyl group, a 2-chloroethyl group, a 2-bromoethyl group, a 1,1-difluoroethyl group, a 2,2,2-trifluoroethyl group, a 1,1,2,2-tetrafluoroethyl group, a 2-chloro-1,1,2-trifluoroethyl group, a pentafluoroethyl group, a 3-bromopropyl group, a 2,2,3,3-tetrafluoropropyl group, a 1,1,2,3,3,3-hexafluoropropyl group, a 1,1,1,3,3,3-hexafluoropropan-2-yl group, a 3-bromo-2-methylpropyl group, a 4-bromobutyl group, a perfluoropentyl group or the like.

It will be noted that as the halogen atom and the alkyl group that may have a branched structure having 1 to 5 carbon atoms, mention is made of those exemplified with respect to the foregoing formulas (2) to (7).

The aldehyde compounds used for the production of the highly branched polymer of the invention include: saturated aliphatic aldehydes such as formaldehyde, paraformaldehyde, acetaldehyde, propylaldehyde, butyraldehyde, isobutyraldehyde, valeraldehyde, caproaldehyde, 2-methylbutyraldehyde, hexylaldehyde, undecanaldehyde, 7-methoxy-3,7-dimethyloctylaldehyde, cyclohexanealdehyde, 3-methyl-2-butyraldehyde, glyoxal, malonaldehyde, succinaldehyde, glutaraldehyde, adipaldehyde and the like; unsaturated aliphatic aldehydes such as acrolein, methacrolein and the like; heterocyclic aldehydes such as furfural, pyridinaldehyde, thiophenaldehyde and the like; and aromatic aldehydes such as benzaldehyde, tolylaldehyde, trifluoromethylbenzaldehyde, phenylbenzaldehyde, salicylaldehyde, anisaldehyde, acetoxybenzaldehyde, to terephthalaldehyde, acetylbenzaldehyde, formylbenzoic acid, methyl formylbenzoate, aminobenzaldehyde, N,N-dimethylaminobenzaldehyde, N,N-diphenylaminobenzaldehyde, naphthylaldehyde, anthrylaldehyde, phenanthrylaldehyde, phenylacetaldehyde, 3-phenylpropionaldehyde and the like. Especially, the use of aromatic aldehydes is preferred.

The ketone compounds used for the production of the highly branched polymer of the invention include alkyl aryl ketones, diaryl ketones and the like and include, for example, acetophenone, propiophenone, diphenyl ketone, phenyl naphthyl ketone, dinaphtyl ketone, phenyl tolyl ketone, ditolyl ketone and the like.

The highly branched polymer used in the invention can be obtained as shown in the following scheme 1 wherein such a triarylamine compound capable of providing such a triarylamine skeleton as set out above and represented, for example, by the following formula (A) and an aldehyde compound and/or ketone compound represented, for example, by the following formula (B) are condensation-polymerized in the presence of an acid catalyst.

It will be noted that if a bifunctional compound (C) including, for example, a phthalaldehyde such as terephthalaldehyde, is used as an aldehyde compound, not only such a reaction as shown in the scheme 1 occurs, but also there may be obtained a highly branched polymer having a crosslinked structure wherein such a reaction as shown in the following scheme 2 takes place thereby permitting the two functional groups to be contributed to the condensation reaction.

Scheme 1

[Chemical Formula 16]

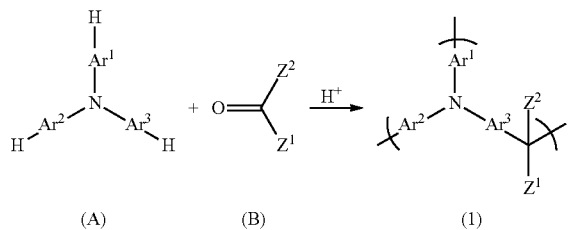

(wherein $Ar^1$ to $Ar^3$ and $Z^1$ and $Z^2$, respectively, have the same meanings as defined before)

Scheme 2

[Chemical Formula 17]

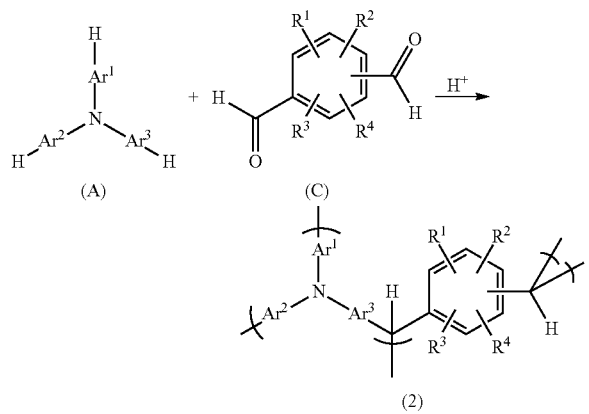

(wherein $Ar^1$ to $Ar^3$ and $R^1$ to $R^4$, respectively, have the same meanings as defined before)

In the above condensation polymerization reaction, the aldehyde compound and/or ketone compound can be used at a rate of 0.1 to 10 equivalents relative to unit equivalent of the aryl group of the triarylamine compound.

The acid catalyst includes: for example, a mineral acid such as sulfuric acid, phosphoric acid, perchloric acid or the like; an organic sulfonic acid such as p-toluenesulfonic acid, p-toluenesulfonic acid monohydrate or the like; and a carboxylic acid such as formic acid, oxalic acid or the like.

The amount of the acid catalyst may differ depending on the type thereof and is generally at 0.001 to 10,000 parts by weight, preferably at 0.01 to 1,000 parts by weight and more preferably at 0.1 to 100 parts by weight, per 100 parts by weight of the triarylamine.

The above condensation reaction may be carried out in a solvent-free condition and is generally conducted by use of a solvent. All types of solvents that do not inhibit the reaction can be used and include: for example, a cyclic ether compound such as tetrahydrofuran, 1,4-dioxane or the like; an amide compound such as N,N-dimethylformamide (DMF), N,N-dimethylacetamide (DMAc), N-methyl-2-pyrrolidone (NMP) or the kike; a ketone compound such as methyl isobutyl ketone, cyclohexanone or the like; a halogenated hydrocarbon such as methylene chloride, chloroform, 1,2-dichloroethane, chlorobenzene or the like; and an aromatic hydrocarbon such as benzene, toluene, xylene or the like. These solvents may be used singly or in admixture of at least two. Especially, cyclic ether compounds are preferred.

If the acid catalyst used is liquid such as, for example, formic acid, the acid catalyst may also permit a role as a solvent.

The condensation reaction temperature is generally at 40 to 200° C. The reaction time may differ depending on the reaction temperature and is generally from about 30 minutes to 50 hours.

The weight average molecular weight Mw of the polymer obtained in this way is generally at 1,000 to 2,000,000, preferably at 2,000 to 1,000,000.

The CNT-containing composition of the invention is one including the CNT dispersant described hereinabove and CNTs.

CNT may be made by an arc discharge method, a chemical vapor deposition method (hereinafter referred to as CVD method), a laser abrasion method or the like. The CNT used in the invention may be one that is obtained by any of such methods. CNT includes single-walled CNT wherein a single carbon film (graphene sheet) is cylindrically wound (hereinafter referred to as SWCNT), double-walled CNT wherein two graphene sheets are concentrically wound (hereinafter referred to as DWCNT), and multi-walled CNT wherein a plurality of graphene sheets are concentrically wound (hereinafter referred to as MWCNT). In the practice of the invention, SWCNT, DWCNT and MWCNT may be used singly or in combination of a plurality thereof.

When SWCNT, DWCNT and MWCNT are made by the above method, by-products, such as fullerene, graphite and amorphous carbon, are formed, and a catalytic metal such as nickel, iron, cobalt, yttrium or the like is left. Hence, there may be some case that removal of these impurities and purification are needed. For the removal of the impurities, ultrasonic treatment is effective along with an acid treatment such as with nitric acid, sulfuric acid or the like. However, with the acid treatment with nitric acid, sulfuric acid or the like, there is the possibility that the π conjugated system constituting CNT is destroyed thereby impeding the characteristic properties inherent to CNT. Thus, it is desirable to use it after purification under appropriate conditions.

With respect to electric characteristics, CNT changes from metallic to semiconducting behavior depending on the manner of graphene sheet winding (helicity or chirality).

The chirality of CNT is defined by the chiral vector ($R=na_1+ma_2$ wherein m and n are an integer) shown in FIG. 1. It is known that in case where n=m and n−m=3p (wherein p is an integer), metallic properties are shown and in other cases (n≠m and n−m≠3p), semiconducting properties are shown. Accordingly, when SWCNT is used, it is important to make a composition wherein some sort of chirality is selectively solubilized (or dispersed).

When using a CNT dispersant made of the highly branched polymer of the invention, there is the possibility of obtaining a composition selectively dispersing CNTs having a specific kind of chirality.

The composition of the invention may further include an organic solvent having the capability of dissolving the dispersant (highly branched polymer).

Such organic solvents include: for example, an ether compound such as tetrahydrofuran (THF), diethyl ether, 1,2-dimethoxyethane (DME) or the like; a halogenated hydrocarbon such as methylene chloride, chloroform, 1,2-dichloroethane or the like; an amide compound such as N,N-dimethylformamide (DMF), N,N-dimethylacetamide (DMAc), N-methyl-2-pyrrolidone (NMP) or the like; a ketone compound such as acetone, methyl ethyl ketone, methyl isobutyl ketone, cyclohexanone or the like; an alcohol such as methanol, ethanol, isopropanol, n-propanol or the like; an aliphatic hydrocarbon such as n-heptane, n-hexane, cyclohexane or the like; and an aromatic hydrocarbon such as benzene, toluene, xylene, ethylbenzene or the like. These organic solvents may be used singly or in combination of at least two.

Especially, from the standpoint of increasing a rate of discrete dispersion of CNTs, NMP, DMF, THF and isopropanol are preferred. As an additive of capable of improving film-forming properties of the composition, it is preferred to contain a small amount of a glycol ether compound such as ethylene glycol monoethyl ether, ethylene glycol monobutyl ether, propylene glycol monomethyl ether or the like, or a ketone compound such as acetone, methyl ethyl ketone, cyclohexanone or the like.

The manner of preparing the composition of the invention is arbitrary. The preparation is made by appropriately mixing the dispersant and CNTs together when the dispersant (highly branched polymer) is liquid or by melting the dispersant and subsequently mixing with CNTs when the dispersant is solid.

If an organic solvent is used, the dispersant, CNTs and an organic solvent may be mixed in an arbitrary order to prepare a composition.

On this occasion, it is preferred to subject the mixture made of a dispersant, CNTs and an organic solvent to dispersion treatment. By the treatment, a rate of discretely dispersed CNTs can be more improved. The dispersion treatment includes a wet treatment making use of a ball mill, a bead mill, a jet mill or the like, which classified as a mechanical treatment, and a ultrasonic treatment making use of a bath-type or probe-type sonicator.

The dispersion treatment time is arbitrary and is preferably from about 5 minutes to 10 hours, more preferably from about 30 minutes to 5 hours.

It will be noted that although the dispersant of the invention is so excellent in dispersibility of CNTs as to provide a composition wherein CNTs can be discretely dispersed at high concentration without carrying out thermal treatment prior to the dispersion treatment, thermal treatment may be performed, if necessary.

The mixing ratio between the dispersant and the CNTs in the CNT composition of the invention can be set at about 1,000:1 to 1:100 on the weight basis.

The concentration of the dispersant in the composition making use of an organic solvent is not critical so far as the concentration is sufficient to enable CNTs to be dispersed in the organic solvent. In the practice of the invention, the concentration is preferably at about 0.001 to 30 wt %, more preferably at about 0.005 to 20 wt %, in the composition.

Moreover, the concentration of CNTs in the composition is arbitrary so far as at least a part of the CNTs is discretely dispersed. In the invention, the concentration is preferably at about 0.0001 to 20 wt %, more preferably at about 0.001 to 10 wt %, in the composition.

In the composition of the invention prepared in this way as set out above, it is assumed that the dispersant is adhered to the surface of the CNTs to form composite.

In the composition of the invention, a general-purpose synthetic resin soluble in such an organic solvent as mentioned before may be mixed to provide complex along therewith.

Examples of the general-purpose synthetic resin include: thermoplastic resins including polyolefin resins such as PE (polyethylene), PP (polypropylene), EVA (ethylene-vinyl acetate copolymer), EEA (ethylene-ethyl acrylate copolymer) and the like; polystyrene resins such as PS (polystyrene), HIPS (high-impact polystyrene), AS (acrylonitrile-styrene copolymer), ABS (acrylonitrile-butadiene-styrene copolymer), MS (methyl methacrylate-styrene copolymer) and the like; polycarbonate resins; vinyl chloride resins; polyamide resins; polyimide resins; (meth)acryl resins such as PMMA (poly(methyl methacrylate)) and the like; polyester resins such as PET (poly(ethylene terephthalate)), poly (butylene terephthalate), poly(ethylene naphthalate), poly (butylene naphthalate), PLA (poly(lactic acid)), poly(3-hydroxybutyric acid), polycaprolactone, poly(butylene succinate), poly(ethylene succinate/adipate) and the like; poly(phenylene ether) resins; modified poly(phenylene ether) resins; polyacetal resins; polysulfone resins; poly(phenylene sulfide) resins; poly(vinyl alcohol) resins; poly(glycolic acid); modified starch; cellulose acetate and cellulose triacetate; chitin and chitosan; and lignin; and thermosetting resins including phenolic resins, urea resins, melamine resins, unsaturated polyester resins, polyurethane resins, epoxy resins and the like.

The CNT composition of the invention may further include a cross-linking agent soluble in such an organic solvent as mentioned before.

Such cross-linking agents include melamine and substituted urea compounds and polymers thereof. These cross-linking agents may be used singly or in admixture of at least two. It will be noted that preferred ones include those having at least two crosslinkable substituent groups, for which mention is made, for example, of CYMEL (registered tradename), methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, butoxymethylated thiourea and the like compounds, and condensed products thereof.

The amount of the cross-linking agent varies depending on the types of organic solvent used and substrate used, a required viscosity, a required film shape and the like, it is at 0.001 to 80 wt %, preferably at 0.01 to 50 wt % and more preferably at 0.05 to 40 wt %, relative to the CNT dispersant (highly branched polymer). Although these cross-linking agents may cause a cross-linking reaction owing to the self-condensation thereof, they are ones that undergo a cross-linking reaction with the highly branched polymer of the invention. If the highly branched polymer has a crosslinkable substituent group therein, the cross-linking reaction is facilitated with the aid of the crosslinkable substituent group thereof.

In the invention, there may be added, as a catalyst for promoting the cross-linking reaction, acidic compounds such as p-toluenesulfonic acid, trifluoromethanesulfonic acid, pyridinium p-toluenesulfonate, salicylic acid, sulfosalicyclic acid, citric acid, benzoic acid, hydroxybenzoic acid, naphthalenecarboxylic acid and the like, and/or thermal acid generators such as 2,4,4,6-tetrabromocyclohexadienone, benzoin tosylate, 2-nitrobenzyl tosylate, organic sulfonic acid alkyl esters and the like.

The amount of the catalyst is at 0.0001 to 20 wt %, preferably at 0.0005 to 10 wt % and more preferably at 0.01 to 3 wt %, relative to the CNT dispersant (highly branched polymer).

The composition of the invention may be one that is obtained by mixing with a matrix resin, followed by melt kneading to provide a composite product.

The matrix resin preferably includes a thermoplastic resin and specific examples are those similar to the thermoplastic resins exemplified before as the general-purpose synthetic resin.

In this case, the composition may be prepared by melt-kneading a dispersant, CNTs, and a matrix resin by use of a kneader to provide a composite product. The kneaders include various types of mixers, uniaxial or biaxial extruders and the like. The kneading temperature and time are, respectively, arbitrary and are appropriately chosen depending on the type of matrix resin.

The CNT concentration in the composition making use of a matrix resin may change depending on the mechanical, electric and thermal characteristics of the composition required and is thus arbitrary. In the invention, the concentration is preferably at about 0.0001 to 30 wt % and more preferably at 0.001 to 20 wt %, in the composition.

The CNT-containing composition (solution) of the invention can be formed into a film by coating onto an appropriate substrate such as PET, glass, ITO or the like according to an appropriate method including a spin coating method, a dipping method, a flow coating method, an inkjet method, a spray method, a bar coating method, a gravure coating method, a slit coating method, a roll coating method, a transfer printing method, a brushing method, a blade coating method, an air knife coating method or the like.

The resulting thin film can be favorably used as a conductive material utilizing metallic properties of CNT, such as antistatic film, a transparent electrode or the like, or a photoelectric conversion element and an electric field light emission element utilizing semiconducting properties thereof.

The highly branched polymer can also be favorably used as a film-forming composition dissolving the polymer in various types of solvents.

The solvent used for the dissolution of the highly branched polymer may be ones, which may be the same or different solvents as used for the polymerization.

Specific examples of such a solvent include toluene, p-xylene, o-xylene, m-xylene, ethylbenzene, styrene, ethylene glycol dimethyl ether, propylene glycol monomethyl ether, ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclohexanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pantanol, 2-methyl-1-pentanol, 2-ethylhexanol, 1-methoxy-2-propanol, tetrahydrofuran, 1,4-dioxane, N,N-dimethylformamide, N,N-dimethylacetamide, N-methyl-2-pyrrolidone, 1,3-dimethyl-2-imidazolidinone, dimethylsulfoxide, N-cyclohexyl-2-pyrrolidinone and the like. These may be used singly or in admixture of at least two.

On this occasion, the solid content in the film-forming composition is not critical so far as storage stability is not influenced and is appropriately chosen depending on the thickness of an intended film. More particularly, from the standpoint of solubility and storage stability, the solid content is preferably at 0.1 to 50 wt % and more preferably at 0.1 to 20 wt %.

So far as the effect of the invention is not impeded, the film-forming composition of the invention may further include, aside from the highly branched polymer and solvent, a leveling agent, a surfactant, a cross-linking agent and the like, for example.

The film-forming composition of the invention can be formed into a desired film by coating onto a substrate and heating, if necessary.

The manner of coating the composition is arbitrary and there can be adopted methods including a spin coating method, a dipping method, a flow coating method, an inkjet method, a spray method, a bar coating method, a gravure coating method, a slit coating method, a roll coating method, a transfer printing method, a brushing method, a blade coating method, an air knife coating method and the like.

As a substrate, there may be used those substrates of silicon, glass forming indium tin oxide (ITO) thereon, glass forming indium zinc oxide (IZO) thereon, poly(ethylene terephthalate) (PET), plastics, glass, quartz, ceramics and the like. A flexible substrate having flexibility may also be used.

The baking temperature is not critical for the purpose of evaporating a solvent and may be, for example, at 40 to 400° C. In this connection, for the purposes of ensuring more uniform film-forming properties and causing the reaction to proceed on a substrate, an at least two-stage temperature change may be made.

The baking method is not critical and may be carried out, for example, by use of a hot plate or oven in an appropriate atmosphere such as air, an inert gas such as nitrogen or the like, or in vacuum.

The baking temperature and time may be chosen from those conditions adapted for a processing procedure of an intended electronic device, and those baking conditions that enable the physical values of the resulting film to be adapted for required characteristics of the electronic device should be chosen.

The film obtained in this way from the film-forming composition of the invention is high in heat resistance, transparency, refractive index and solubility and low in volume shrinkage, so that it can be conveniently utilized as a constituent material for making electronic devices including a liquid crystal display, an organic electroluminescent (EL) display, a light-emitting diode (LED) device, a solid-state image sensing device, an organic thin film solar cell, a dye-sensitized solar cell, an organic thin film transistor (TFT) and the like.

EXAMPLES

Examples and Comparative Examples are shown to more particularly illustrate the invention, which should not be construed as limited thereto.

It will be noted that the apparatus and conditions used for preparing samples and analyzing physical properties in the following are described below.

(1) GPC (Gel Permeation Chromatography)
   Conditions A (which were used unless otherwise specified)
   Apparatus: HLC-8200 GPC, made by Tosoh Corporation
   Column: Shodex KF-804L+KF-805L
   Column temperature: 40° C.
   Solvent: tetrahydrofuran
   Detector: UV (254 nm)
   Calibration curve: standard polystyrene
   Conditions B
   Apparatus: LC-10AD (HPLC), made by Shimadzu Corporation
   Column: Shodex KF-804L
   Column temperature: 60° C.
   Solvent: N-methyl-2-pyrrolidone solution of 1.0 g/liter of LiCl
   Detector: UV (280 nm)
   Calibration curve: standard polystyrene
(2) Hot Plate
   Apparatus: ND-2, made by AS ONE Corporation
(3) Probe-Type Ultrasonic Irradiation Device (Dispersion Treatment)
   Apparatus: UIP1000, made by Hielscher Ultrasonics GmbH
(4) Ultrasonic Washer (Dispersion Treatment)
   Apparatus: FU-6H, made by TGK
(5) Resistivity Meter (Surface Resistivity Measurement)
   Apparatus: Loresta GP, made by Mitsubishi Chemical Corporation
   Probe: 4-pin probe ASP (inter-pin distance: 5 mm), made by Mitsubishi Chemical Corporation
(6) Haze Meter (Measurement of Total Light Transmittance)
   Apparatus: NDH5000, made by Nippon Denshoku Industries Co., Ltd.
(7) Small-Sized High-Speed Refrigerated Centrifuge (Centrifugal Separation)
   Apparatus: SRX-201, made by Tomy Seiko Co., Ltd.
(8) Ultraviolet-Visible Light-Near Infrared Spectrophotometer (Measurement of Absorbance)
   Apparatus: UV-3600, made by Shimadzu Corporation
   Measured wavelength: 400 to 1650 nm
(9) Near-Infrared Fluorospectrophotometer (Measurement of Fluorescence Spectrum)
   Apparatus: NanoLog, made by Horiba Jobin Yvon S.A.S.
   Excitation wavelength: 500 to 900 nm
   Measured (fluorescence) wavelength: 945 to 1450 nm
(10) Air Brush
   Device: Revolution HP-TR2, made by Anest Iwata Corporation
   Nozzle diameter: 0.5 mm
   Bottle capacity: 15 ml
(11) Ultraviolet Visible Light Spectrophotometer (Light Transmittance Spectrum)
   Apparatus: Shimadzu UV-3600, made by Shimadzu Corporation
(12) Ellipsometer (Refractive Index, Film Thickness)
   Apparatus: variable angle spectroscopic ellipsometry VASE, made by J.A. Woollam Japan Co., Inc.
(13) Differential Thermal Balance (TG-DTA)
   Device: TG-8120, made by Rigaku Corporation
   Temperature rise rate: 10° C./minute
   Measuring temperature: 25° C. to 750° C.
(14) UV/Visible Light Irradiation, Differential Scanning Calorimeter (Photo-DSC)
   Apparatus: Photo-DSC 204 F1 Phoenix, made by Netzsch
   Temperature rise rate: 40° C./minute
   Measuring temperature: 25° C. to 350° C.
CNT-1: non-purified MWCNT ("C Tube 100" with an outer diameter of 10 to 30 nm, made by CNT Inc. Co.)
CNT-2: non-purified SWCNT (HiPco, made by Carbon Nanotechnologies Inc.)
CNT-3: purified SWCNT (made by Unidym, Inc.)
CNT-4: small-diameter MWCNT ("MWNTs>95 wt %/<8 nm", outer diameter<8 nm, made by Cheap Tubes Inc.)
CNT-5: middle fiber diameter MWCNT-1 ("VGCF-X", with an outer diameter of 15 nm, made by Showa Denko K.K.)
CNT-6: middle fiber diameter MWCNT-2 ("CM-95" with an outer diameter of 10 to 15 nm, made by Hanwha Nanotech Corporation)
CNT-7: middle fiber diameter MWCNT-3 ("Nanocyl-700", with an outer diameter at 10 nm, made by Nanocyl Inc.)
CNT-8: large-diameter MWNT ("MWNTs>95 wt %/20 to 40 nm," with an outer diameter of 20 to 40 nm, made by Cheap Tubes Inc.)
CNT-9: extra large-diameter MWCNT ("MWCNTs>95 wt %/>50 nm", with an outer diameter>50 nm, made by Cheap Tubes Inc.)
CNT-10: purified SWCNT-1 (made by KH Chemicals Inc.)
CNT-11: purified SWCNT-2 ("FH-P", made by Meijo Nano Carbon Co., Ltd.)
CNT-12: purified SWCNT-3 ("ASP-100F", made by Hanwha Nanotech Inc.)
PVP: polyvinylpyrrolidone (K15, made by Tokyo Chemical Industry Co., Ltd.)
NMP: N-methyl-2-pyrrolidone
THF: tetrahydrofuran
CHN: cyclohexanone

[1] Synthesis 1 of Dispersant (Triarylamine-based Highly Branched Polymer)

Example 1

Synthesis of Highly Branched Polymer PTPA-pAA 3.0 g (12.2 mmols) of triphenylamine [made by Tokyo Chemical Industry Co., Ltd., herein and whenever it appears hereinafter], 1.7 g (12.4 mmols (1.01 equivalents relative to triphenylamine)) of p-anisaldehyde [made by Junsei Chemical Co., Ltd.], 0.26 g (1.4 mmols (0.1 equivalent)) of para-toluenesulfonic acid monohydrate [made by Kanto Chemical Co., Inc.] and 3.0 g of 1,4-dioxane were charged into a 100 ml four-necked flask under nitrogen. The mixture was heated to 120° C. while stirring and dissolved to start polymerization. After the reaction for 2 hours, the reaction mixture was allowed to cool down to 60° C. The reaction mixture was diluted with 10 g of chloroform and re-precipitated by charging into 100 g of methanol. The settled precipitate was filtered and the resulting solid was re-dissolved in 10 g of chloroform, followed by charging into 100 g of methanol to cause re-precipitation again. The settled precipitate was filtered and dried under reduced pressure at 60° C. for 10 hours to obtain 3.2 g of intended highly branched polymer PTPA-pAA (hereinafter referred to simply as PTPA-pAA).

The weight average molecular weight Mw of the thus obtained PTPA-pAA, measured by GPC and calculated as polystyrene, was at 42,000 and the polydispersity Mw/Mn was at 5.83 (wherein Mn represents a number average molecular weight measured under the same conditions herein and whenever it appears hereinafter).

Example 2

Synthesis of Highly Branched Polymer PTPA-PBA-1

1.0 g (4.1 mmols) of triphenylamine, 1.5 g (8.2 mmols (2.0 equivalents)) of 4-phenylbenzaldehyde [made by Tokyo Chemical Industry Co., Ltd., herein and whenever it appears hereinafter], 0.23 g (1.2 mmols (0.3 equivalents)) of paratoluenesulfonic acid monohydrate [made by Junsei Chemical Co., Ltd.] and 3.0 g of 1,4-dioxane were charged into a 50 ml four-necked flask under nitrogen. While stirring, the mixture was heated to 100° C. and dissolved to start polymerization. After the reaction for 2 hours and 15 minutes, the reaction mixture was allowed to cool down to 60° C. This reaction mixture was diluted with 20 g of THF and re-precipitated by charging into a mixed solution of 50 g of acetone, 50 g of methanol and 4 g of 28% aqueous ammonia. The settled precipitate was filtered and dried under reduced pressure, followed by re-dissolving the resulting solid in 20 g of THF and again re-precipitating by charging into a mixed solution of 50 g of acetone and 50 g of methanol. The settled precipitate was filtered and dried under reduced pressure at 130° C. for 6 hours to obtain 1.2 g of intended highly branched polymer PTPA-PBA-1 (hereinafter referred to simply as PTPA-PBA-1).

The weight average molecular weight Mw of the thus obtained PTPA-PBA-1, measured by GPC and calculated as polystyrene, was at 13,000 and the polydispersity Mw/Mn was at 2.93.

Example 3

Synthesis of Highly Branched Polymer PTPA-PBA-2

1.0 g (4.1 mmols) of triphenylamine, 1.5 g (8.2 mmols (2.0 equivalents)) of 4-phenylbenzaldehyde, 0.23 g (1.2 mmols (0.3 equivalents)) of paratoluenesulfonic acid monohydrate [made by Junsei Chemical Co., Ltd.] and 3.0 g of 1,4-dioxane were charged into a 50 ml four-necked flask under nitrogen. While stirring, the mixture was heated to 100° C. and dissolved to start polymerization. After the reaction for 2 hours and 25 minutes, the reaction mixture was allowed to cool down to 60° C. This reaction mixture was diluted with 20 g of THF and re-precipitated by charging into a mixed solution of 50 g of acetone, 50 g of methanol and 4 g of 28% aqueous ammonia. The settled precipitate was filtered and dried under reduced pressure, followed by re-dissolving the resulting solid in 20 g of THF and again re-precipitating by charging into a mixed solution of 50 g of acetone and 50 g of methanol. The settled precipitate was filtered and dried under reduced pressure at 130° C. for 6 hours to obtain 1.6 g of intended highly branched polymer PTPA-PBA-2 (hereinafter referred to simply as PTPA-PBA-2).

The weight average molecular weight Mw of the thus obtained PTPA-PBA-2, measured by GPC and calculated as polystyrene, was at 41,000 and the polydispersity Mw/Mn was at 6.62.

Example 4

Synthesis of Highly Branched Polymer PTPA-TA 5.0 g (20.4 mmols) of triphenylamine, 4.6 g (40.8 mmols (2.0 equivalents)) of 3-thiophenaldehyde [made by Tokyo Chemical Industry Co., Ltd.], 8.9 g (46.9 mmols (2.3 equivalents)) of paratoluenesulfonic acid monohydrate [made by Junsei Chemical Co., Ltd.] and 15 g of 1,4-dioxane were charged into a 100 ml four-necked flask under nitrogen. While stirring, the mixture was heated to 80° C. and dissolved to start polymerization. After the reaction for 50 minutes, the reaction mixture was allowed to cool down to 60° C. This reaction mixture was diluted with 150 g of THF and re-precipitated by charging into a mixed solution of 200 g of acetone, 200 g of methanol and 8 g of 28% aqueous ammonia. The settled precipitate was filtered and dried under reduced pressure, followed by re-dissolving the resulting solid in 100 g of THF and again re-precipitating by charging into a mixed solution of 200 g of acetone and 200 g of methanol. The settled precipitate was filtered and dried under reduced pressure at 130° C. for 6 hours to obtain 6.7 g of intended highly branched polymer PTPA-TA (hereinafter referred to simply as PTPA-TA).

The weight average molecular weight Mw of the thus obtained PTPA-TA, measured by GPC and calculated as polystyrene, was at 77,000 and the polydispersity Mw/Mn was at 11.25. It will be noted that conditions B were used for the measurement of the molecular weights.

Example 5

Synthesis of Highly Branched Polymer PTPA-TPA 3.0 g (12.2 mmols) of triphenylamine, 0.84 g (6.2 mmols (0.51 equivalents)) of terephthalaldehyde [made by Junsei Chemical Co., Ltd.], 0.23 g (1.4 mmols (0.1 equivalent)) of paratoluenesulfonic acid monohydrate [made by Kanto Chemical Co., Inc.] and 3.0 g of 1,4-dioxane were charged into a 100 ml four-necked flask under nitrogen. While stirring, the mixture was heated to 110° C. and dissolved to start polymerization. After the reaction for 2 hours, the reaction mixture was allowed to cool down to 60° C. This reaction mixture was diluted with 10 g of THF and re-precipitated by charging into 100 g of acetone. The settled precipitate was filtered, followed by re-dissolving the resulting solid in 10 g of THF and again re-precipitating by charging into 100 g of acetone. The settled precipitate was filtered and dried under reduced pressure at 60° C. for 10 hours to obtain 2.2 g of intended highly branched polymer PTPA-TPA (hereinafter referred to simply as PTPA-TPA).

The weight average molecular weight Mw of the thus obtained PTPA-TPA, measured by GPC and calculated as polystyrene, was at 45,000 and the polydispersity Mw/Mn was at 7.10.

Example 6

Synthesis of Highly Branched Polymer PTPA-TFMBA 1.0 g (4.1 mmols) of triphenylamine, 1.4 g (8.2 mmols (2.0 equivalents)) of 4-trifluoromethylbenzaldehyde [made by Tokyo Chemical Industry Co., Ltd.], 0.23 g (1.2 mmols (0.3 equivalents)) of paratoluenesulfonic acid monohydrate [made by Junsei Chemical Co., Ltd.] and 3.0 g of 1,4-dioxane were charged into a 50 ml four-necked flask under nitrogen. While stirring, the mixture was heated to 100° C. and dissolved to start polymerization. After the reaction for 40 minutes, the reaction mixture was allowed to cool down to 60° C. This reaction mixture was diluted with 20 g of toluene and re-precipitated by charging into a mixed solution of 50 g of acetone, 50 g of methanol and 4 g of 28% aqueous ammonia. The settled precipitate was filtered and dried under reduced pressure, followed by re-dissolving the resulting solid in 20 g of toluene and again re-precipitating by charging into a mixed solution of 50 g of acetone and 50 g of methanol. The settled precipitate was filtered and dried under reduced pressure at 130° C. for 6 hours to obtain 0.99 g of intended highly branched polymer PTPA-TFMBA (hereinafter referred to simply as PTPA-TFMBA).

The weight average molecular weight Mw of the thus obtained PTPA-TFMBA, measured by GPC and calculated as polystyrene, was at 7,200 and the polydispersity Mw/Mn was at 1.78.

Synthetic Example 1

Synthesis of Highly Branched Polymer PTPA-BA-1

3.0 g (12.2 mmols) of triphenylamine, 1.3 g (12.3 mmols (1.01 equivalents)) of benzaldehyde [made by Junsei Chemical Co., Ltd., herein and whenever it appears hereinafter], 0.26 g (1.4 mmols (0.1 equivalent)) of paratoluenesulfonic acid monohydrate [made by Kanto Chemical Co., Inc.] and 3.0 g of 1,4-dioxane were charged into a 100 ml four-necked flask under nitrogen. While stirring, the mixture was heated to 100° C. and dissolved to start polymerization. After the reaction for 2 hours, the reaction mixture was allowed to cool down to 60° C. This reaction mixture was diluted with 20 g of chloroform and re-precipitated by charging into 100 g of methanol. The settled precipitate was filtered and the resulting solid was re-dissolved in 20 g of chloroform and re-precipitated by charging into 100 g of acetone. The settled precipitate was filtered and dried under reduced pressure at 60° C. for 10 hours to obtain 2.8 g of intended highly branched polymer PTPA-BA-1 (hereinafter referred to simply as PTPA-BA-1).

The weight average molecular weight Mw of the thus obtained PTPA-BA-1, measured by GPC and calculated as polystyrene, was at 11,000 and the polydispersity Mw/Mn was at 2.75.

Synthetic Example 2

Synthesis of Highly Branched Polymer PTPA-BA-2

3.0 g (12.2 mmols) of triphenylamine, 2.0 g (18.4 mmols (1.5 equivalents)) of benzaldehyde, 0.24 g (1.3 mmols (0.1 equivalent)) of paratoluenesulfonic acid monohydrate [made by Kanto Chemical Co., Inc.] and 3.0 g of 1,4-dioxane were charged into a 100 ml four-necked flask under nitrogen. While stirring, the mixture was heated to 100° C. and dissolved to start polymerization. After the reaction for 1 hour and 40 minutes, the reaction mixture was allowed to cool down to 60° C. This reaction mixture was diluted with 10 g of THF and re-precipitated by charging into 100 g of acetone. The settled precipitate was filtered and dried under reduced pressure at 60° C. for 10 hours to obtain 2.3 g of intended highly branched polymer PTPA-BA-2 (hereinafter referred to simply as PTPA-BA-2).

The weight average molecular weight Mw of the thus obtained PTPA-BA-2, measured by GPC and calculated as polystyrene, was at 81,000 and the polydispersity Mw/Mn was at 12.04.

Synthetic Example 3

Synthesis of Highly Branched Polymer PTPA-DPABA 0.5 g (2.1 mmols) of triphenylamine, 1.1 g (4.1 mmols (2.0 equivalents)) of 4-(N,N-diphenylamino)benzaldehyde [made by Tokyo Chemical Industry Co., Ltd.], 0.19 g (1.0 mmol (0.5 equivalents)) of paratoluenesulfonic acid monohydrate [made by Junsei Chemical Co., Ltd.] and 2.0 g of 1,4-dioxane were charged into a 50 ml four-necked flask under nitrogen. While stirring, the mixture was heated to 100° C. and dissolved to start polymerization. After the reaction for 3 hours, the reaction mixture was allowed to cool down to 60° C. This reaction mixture was diluted with 10 g of THF and re-precipitated by charging into a mixed solution of 50 g of acetone, 50 g of methanol and 4 g of 28% aqueous ammonia. The settled precipitate was filtered and dried under reduced pressure, and the resulting solid was re-dissolved in 10 g of THF and again re-precipitated by charging into a mixed solution of 50 g of acetone and 50 g of methanol. The settled precipitate was filtered and dried under reduced pressure at 130° C. for 6 hours to obtain 0.64 g of intended highly branched polymer PTPA-DPABA (hereinafter referred to simply as PTPA-DPABA).

The weight average molecular weight Mw of the thus obtained PTPA-DPABA, measured by GPC and calculated as polystyrene, was at 13,000 and the polydispersity Mw/Mn was at 2.89.

Synthetic Example 4

Synthesis of Highly Branched Polymer PTPA-FA 5.0 g (20.4 mmols) of triphenylamine, 2.6 g (30.6 mmols (1.5 equivalents)) of 36 to 38% formaldehyde solution [made by Wako Pure Chemical Industries, Ltd.], 0.41 g (2.1 mmols (0.1 equivalent)) of paratoluenesulfonic acid monohydrate [made by Kanto Chemical Co., Inc.] and 5.0 g of 1,4-dioxane were charged into a 100 ml four-necked flask under nitrogen. While stirring, the mixture was heated to 110° C. and dissolved to start polymerization. After the reaction for 2 hours, the reaction mixture was allowed to cool down to 60° C. This reaction mixture was diluted with 17 g of THF and re-precipitated by charging into a mixed solution of 85 g of acetone and 85 g of hexane. The settled precipitate was filtered and the resulting solid was re-dissolved in 17 g of THF, followed by re-precipitation by charging into a mixed solution of 85 g of acetone and 85 g of hexane. The settled precipitate was filtered and dried under reduced pressure at 60° C. for 10 hours to obtain 2.6 g of intended highly branched polymer PTPA-FA (hereinafter referred to simply as PTPA-FA).

The weight average molecular weight Mw of the thus obtained PTPA-FA, measured by GPC and calculated as polystyrene, was at 4,700 and the polydispersity Mw/Mn was at 1.79.

Reference 1

Synthesis of Linear Polymer PDPA-BA 2.0 g (11.8 mmols) of diphenylamine [made by Tokyo Chemical Industry Co., Ltd.], 1.3 g (11.9 mmols (1.01 equivalents)) of benzaldehyde, 0.25 g (1.3 mmols (0.1 equivalent)) of paratoluenesulfonic acid monohydrate [made by Kanto Chemical Co., Inc.] and 2.0 g of 1,4-dioxane were charged into a 100 ml four-necked flask under nitrogen. While stirring, the mixture was heated to 100° C. and dissolved to start polymerization. After the reaction for 2 hours, the reaction mixture was allowed to cool down to 60° C. This reaction mixture was diluted with 20 g of THF and re-precipitated by charging into 70 g of methanol. The settled precipitate was filtered and dried under reduced pressure at 60° C. for 10 hours to obtain 2.7 g of intended linear polymer PDPA-BA (hereinafter referred to simply as PDPA-BA).

The weight average molecular weight Mw of the thus obtained PDPA-BA, measured by GPC and calculated as polystyrene, was at 32,000 and the polydispersity Mw/Mn was at 5.78.

Reference 2

Synthesis of Highly Branched Polymer PTPA-Br

A bromine-terminated product PTPA-Br (hereinafter referred to simply as PTPA-Br) of a highly branched polymer having repeating units of triphenylamine was prepared according to a method, described in JP-A H10-306143, wherein a mono-Grignard compound of tris(4-bromophenyl)amine was polycondensed in the presence of a nickel (II) complex.

The weight average molecular weight Mw, measured by GPC and calculated as polystyrene, of the resulting PTPA-Br was at 5,400.

[2] Preparation 1 of Carbon Nano-tube-containing Compositions and Thin Films

Example 7

Dispersion (1) of CNT-1 by Using PTPA-BA-1

0.50 g of PTPA-BA-1 synthesized in Synthetic Example 1 as a dispersant was dissolved in 49.25 g of NMP, to which 0.25 g of CNT-1 was added as MWCNT. This mixture was subjected to ultrasonic treatment for 30 minutes at room temperature (about 25° C.) by use of a probe-type ultrasonic irradiation device to obtain a black MWCNT-containing dispersion wherein MWCNTs were uniformly dispersed without precipitation.

0.25 g of butyl cellosolve was added to 1.0 g of the MWCNT-containing dispersion to prepare a thin film-forming composition. 50 μl of the thus obtained composition was uniformly applied over a glass substrate by use of an applicator having a slit thickness of 25.4 μm and dried at 100° C. for about 2 minutes to provide a transparent, uniform MWCNT/PTPA-PBA-1 thin film composite.

Example 8

Dispersion (2) of CNT-1 by Using PTPA-BA-1

In the same manner as in Example 7 except that the amount of PTPA-BA-1 was changed to 0.25 g and the amount of NMP was changed to 49.50 g, respectively, there were prepared an MWCNT-containing dispersion and an MWCNT/PTPA-BA-1 thin film composite.

Example 9

Dispersion of CNT-1 by Using PTPA-BA-2

In the same manner as in Example 7 except that the dispersant was changed to PTPA-BA-2 prepared in Synthetic Example 2, there were prepared an MWCNT-containing dispersion and an MWCNT/PTPA-BA-2 thin film composite.

Example 10

Dispersion (1) of CNT-1 by Using PTPA-pAA

In the same manner as in Example 7 except that the dispersant was changed to PTPA-pAA prepared in Example 1, there were prepared an MWCNT-containing dispersion and a MWCNT/PTPA-pAA thin film composite.

Example 11

Dispersion (2) of CNT-1 by Using PTPA-pAA

In the same manner as in Example 7 except that the dispersant and amount thereof were changed to 0.25 g of PTPA-pAA prepared in Example 1 and the amount of NMP was changed to 49.50 g, respectively, there were prepared an MWCNT-containing dispersion and an MWCNT/PTPA-pAA thin film composite.

Example 12

Dispersion of CNT-1 by Using PTPA-PBA-1

In the same manner as in Example 7 except that the dispersant was changed to PTPA-PBA-1 prepared in Example 2, there were prepared an MWCNT-containing dispersion and an MWCNT/PTPA-BA-1 thin film composite.

Example 13

Dispersion of CNT-1 by Using PTPA-TA

In the same manner as in Example 7 except that the dispersant was changed to PTPA-TA prepared in Example 4, there were prepared an MWCNT-containing dispersion and an MWCNT/PTPA-TA thin film composite.

Example 14

Dispersion of CNT-1 by Using PTPA-TPA

In the same manner as in Example 7 except that the dispersant was changed to PTPA-TPA prepared in Example 5, there were prepared an MWCNT-containing dispersion and an MWCNT/PTPA-TPA thin film composite.

Example 15

Dispersion of CNT-1 by Using PTPA-DPABA

In the same manner as in Example 7 except that the dispersant was changed to PTPA-DPABA prepared in Synthetic Example 3, there were prepared an MWCNT-containing dispersion and an MWCNT/PTPA-DPABA thin film composite.

Example 16

Dispersion of CNT-1 by Using PTPA-FA

In the same manner as in Example 7 except that the dispersant was changed to PTPA-FA prepared in Synthetic Example 4, there were prepared an MWCNT-containing dispersion and an MWCNT/PTPA-FA thin film composite.

Comparative Example 1

Dispersion of CNT-1 by Using PDPA-BA

In the same manner as in Example 7 except that the dispersant was changed to PDPA-BA prepared in Reference 1, there were prepared an MWCNT-containing dispersion and an MWCNT/PDPA-BA thin film composite.

Comparative Example 2

Dispersion (1) of CNT-1 by Using PVP

In the same manner as in Example 7 except that the dispersant was changed to PVP, there were prepared an MWCNT-containing dispersion and an MWCNT/PVP thin film composite.

Comparative Example 3

Dispersion (2) of CNT-1 by Using PVP

In the same manner as in Example 7 except that the dispersant and its amount were changed to 0.25 g of PVP and the amount of NMP was changed to 49.50 g, respectively, there were prepared an MWCNT-containing dispersion and an MWCNT/PVP thin film composite.

Comparative Example 4

Dispersion of CNT-1 by Using PTPA-Br

In the same manner as in Example 7 except that the dispersant was changed to PTPA-Br prepared in Reference 2, there were prepared an MWCNT-containing dispersion and an MWCNT/PTPA-Br thin film composite.

The thin film composites obtained in the above Examples 7 to 16 and Comparative Examples 1 to 4 were evaluated with respect to the thin film uniformity, surface resistivity and total light transmittance. It will be noted that the thin film uniformity was evaluated by visual observation based on the following standards. The results of the evaluation are shown in Table 1.

<Thin Film Uniformity>
○: Neither a lump such as a coagulation nor film unevenness (shading) can be confirmed.
Δ: A coagulation of MWCNT or film unevenness (shading) is observed.
x: A coagulation of MWCNT or film unevenness (shading) is observed almost in all portions of thin film, disabling evaluation as a film.

Additionally, the above-obtained MWCNT-containing dispersions were allowed to stand at room temperature (about 25° C.) for 1 month, followed by confirming the presence of precipitates in the dispersion by visual observation, thereby evaluating dispersion stability of the dispersion according to the following standards. The results of the evaluation are also shown in Table 1.

<Dispersion Stability>
○: No precipitate can be confirmed.
Δ: A precipitate is observed.
x: A dispersion state cannot be held and most of the MWCNT appears as a precipitate.

As shown in Table 1, when comparing Example 7 and Comparative Example 1 for comparison with the linear polymer (PDPA-BA) having a similar skeleton, it will be clearly seen that the use of the dispersant of the invention enables CNT to be stably dispersed at the high concentration, thus revealing that the highly branched structure is important for the dispersion of CNT. Besides, for comparison with PVP that is a known dispersant, when comparing Examples 7, 9, 10, 12, 13, 14, 15, 16 and Comparative Example 2 with one another and also comparing Examples 8, 11 and Comparative Example 3 wherein the CNT/dispersant mixing ratios are at the same level, respectively, it will be seen that the thin films with PVP are non-uniform and cannot be correctly evaluated, although the surface resistivities and total light transmittances are indicated as reference values. On the other hand, the case using the dispersants of the invention, the uniformity of CNT in the preparation of the thin films is high, with the result that the surface resistivities stably indicate a level of $10^3$ to $10^4 \Omega/\square$ and the total light transmittances are equal to or larger than the comparative one as well. From the foregoing, it has been revealed that the dispersants of the invention are advantageous in obtaining highly conductive, uniform thin film composite.

As will be apparent from the comparison between Example 7 and Examples 10, 14 and also between Example 8 and Example 11, the dispersants of the invention are controllable with respect to the characteristics (surface resistivity, total light transmittance) of thin film composites obtained from aldehydes (functional groups) used for the reaction, thus being advantageous in this regard.

Example 17

Dispersion of CNT-2 by Using PTPA-BA-1

1 mg of PTPA-BA-1 prepared in Synthetic Example 1 as a dispersant was dissolved in 5 ml of NMP, to which 0.5 mg of CNT-2 as SWCNT was added. This mixture was subjected to ultrasonic treatment at room temperature for 1 hour by use of an ultrasonic bath and centrifugally separated at room temperature (about 25° C.) at 10,000 G for 1 hour to collect a black transparent SWCNT-containing dispersion as a supernatant liquid.

TABLE 1

|  | Dispersant | CNT/dispersant mixing ratio (by weight) | Dispersion stability | Thin film uniformity | Surface resistivity value [$\Omega/\square$] | Total light transmittance [%] |
|---|---|---|---|---|---|---|
| Example 7 | PTPA-BA-1 | 1/2 | ○ | ○ | $1.2 \times 10^4$ | 54.4 |
| Example 8 | PTPA-BA-1 | 1/1 | ○ | ○ | $8.4 \times 10^3$ | 52.6 |
| Example 9 | PTPA-BA-2 | 1/2 | ○ | ○ | $1.4 \times 10^4$ | 56.1 |
| Example 10 | PTPA-pAA | 1/2 | ○ | ○ | $7.4 \times 10^3$ | 55.3 |
| Example 11 | PTPA-pAA | 1/1 | ○ | ○ | $5.9 \times 10^3$ | 56.3 |
| Example 12 | PTPA-PBA-1 | 1/2 | ○ | ○ | $3.2 \times 10^4$ | 53.3 |
| Example 13 | PTPA-TA | 1/2 | ○ | ○ | $2.1 \times 10^4$ | 52.1 |
| Example 14 | PTPA-TPA | 1/2 | ○ | ○ | $6.8 \times 10^3$ | 55.2 |
| Example 15 | PTPA-DPABA | 1/2 | ○ | ○ | $3.2 \times 10^4$ | 53.3 |
| Example 16 | PTPA-FA | 1/2 | ○ | ○ | $1.6 \times 10^4$ | 52.1 |
| Comparative Example 1 | PDPA-BA | 1/2 | X | X | — | — |
| Comparative Example 2 | PVP | 1/2 | ○ | Δ | ($1.0 \times 10^4$) | (56.3) |
| Comparative Example 3 | PVP | 1/1 | ○ | Δ | ($7.6 \times 10^3$) | (55.6) |
| Comparative Example 4 | PDPA-Br | 1/2 | X | X | — | — |

* The numeral values in parentheses in the table are reference values because accurate measurement cannot be made owing to the considerable unevenness of film.

The thus collected black transparent SWCNT-containing dispersion was subjected to measurement of ultraviolet-visible light-infrared absorption spectrum, revealing that a semiconducting $S_{11}$ absorption band (1,400 to 1,000 nm), an $S_{22}$ absorption band (1,000 to 600 nm) and a metal absorption band (600 to 450 nm) were clearly observed, thus confirming that SWCNTs were dispersed to a discrete dispersion state.

Further, the measurement of the near infrared fluorescent spectrum of the thus obtained SWCNT-containing dispersion revealed that a fluorescent emission corresponding to chirality to be observed only for the discretely dispersed semiconducting CNTs was observed, confirming that the SWCNTs were discretely dispersed.

The resulting SWCNT-containing dispersion was dropped over a poly(ethylene terephthalate) (PET) substrate and applied by means of a bar coater having a slit thickness of 27 µm to obtain a transparent uniform CNT-2/PTPA-BA-1 thin film composite.

Example 18

Dispersion of CNT-3 by Using PTPA-BA-1

In the same manner as in Example 17 except that SWCNT was changed to CNT-3, there was prepared a black transparent SWCNT-containing dispersion, and this dispersion was evaluated. From the measurement of ultraviolet-visible light-infrared absorption spectrum, a semiconducting $S_{11}$ absorption band, $S_{22}$ absorption band and metal absorption band were clearly observed, confirming that SWCNTs were dispersed to a discrete dispersion state.

In the same manner as in Example 17, the dispersion was dropped over a PET substrate and applied by means of a bar coater having a slit thickness of 27 µm to obtain a transparent uniform CNT-3/PTPA-BA-1 thin film composite.

Example 19

Dispersion of CNT-2 by Using PTPA-PBA-1

In the same manner as in Example 17 except that the dispersant was changed to PTPA-PBA-1 prepared in Example 2, there was prepared a black transparent SWCNT-containing dispersion, and this dispersion was evaluated. From the measurement of ultraviolet-visible light-infrared absorption spectrum, it was observed that the intensities of absorptions that were found when SWCNTs were discretely dispersed were greater than those of Example 17, confirming that SWCNTs were dispersed to a discrete dispersion state at higher concentration.

From the measurement of near infrared fluorescent spectrum, a fluorescent emission corresponding to the chirality to be observed only for the discretely dispersed semiconducting CNTs was observed, confirming that SWCNTs were discretely dispersed.

In the same manner as in Example 17, the dispersion was dropped over a PET substrate and applied by means of a bar coater having a slit thickness of 27 µm to obtain a transparent uniform CNT-2/PTPA-PBA-1 thin film composite.

Example 20

Dispersion of CNT-3 by Using PTPA-PBA-1

In the same manner as in Example 17 except that the dispersant was changed to PTPA-PBA-1 prepared in Example 2 and SWCNT was changed to CNT-3, there was prepared a black transparent SWCNT-containing dispersion, and this dispersion was evaluated. From the measurement of ultraviolet-visible light-infrared absorption spectrum, it was observed that the intensities of absorptions that were found when SWCNTs were discretely dispersed were greater than those of Example 18, confirming that SWCNTs were dispersed to a discrete dispersion state at higher concentration.

From the measurement of the near infrared fluorescent spectrum, a fluorescent emission corresponding to the chirality to be observed only for the discretely dispersed semiconducting CNTs was observed, confirming that SWCNTs were discretely dispersed.

In the same manner as in Example 17, the dispersion was dropped over a PET substrate and applied by means of a bar coater having a slit thickness of 27 µm to obtain a transparent uniform CNT-3/PTPA-PBA-1 thin film composite.

Example 21

Dispersion of CNT-2 by Using PTPA-PBA-2

In the same manner as in Example 17 except that the dispersant was changed to PTPA-PBA-2 prepared in Example 3, there was prepared a black transparent SWCNT-containing dispersion, and this dispersion was evaluated. From the measurement of ultraviolet-visible light-infrared absorption spectrum, it was observed that the intensities of absorptions that were found when SWCNTs were discretely dispersed were greater than those of Example 17, confirming that SWCNTs were dispersed to a discrete dispersion state at higher concentration.

Figure 2:
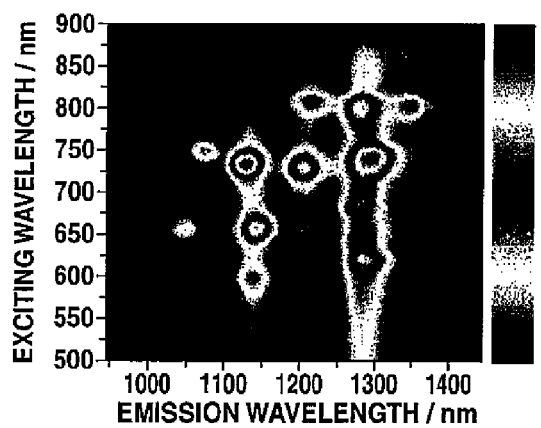
FIG. 2 is a figure showing a near-infrared fluorescence spectrum of a SWCNT-containing dispersion obtained in Example 21.

Further, from the measurement of the near infrared fluorescent spectrum, a fluorescent emission corresponding to the chirality to be observed only for the discretely dispersed semiconducting CNTs was observed, confirming that SWCNTs were discretely dispersed. The resulting near infrared fluorescent spectrum is shown in FIG. 2.

In the same manner as in Example 17, the dispersion was dropped over a PET substrate and applied by means of a bar coater having a slit thickness of 27 µm to obtain a transparent uniform CNT-2/PTPA-PBA-2 thin film composite.

Example 22

Dispersion (1) of CNT-3 by Using PTPA-PBA-2

In the same manner as in Example 17 except that the dispersant was changed to PTPA-PBA-2 prepared in Example 3 and SWCNT was changed to CNT-3, there was prepared a black transparent SWCNT-containing dispersion, and this dispersion was evaluated. From the measurement of ultraviolet-visible light-infrared absorption spectrum, it was observed that the intensities of absorptions that were found when SWCNTs were discretely dispersed were greater than those of Example 18, confirming that SWCNTs were dispersed to a discrete dispersion state at higher concentration.

Figure 3:
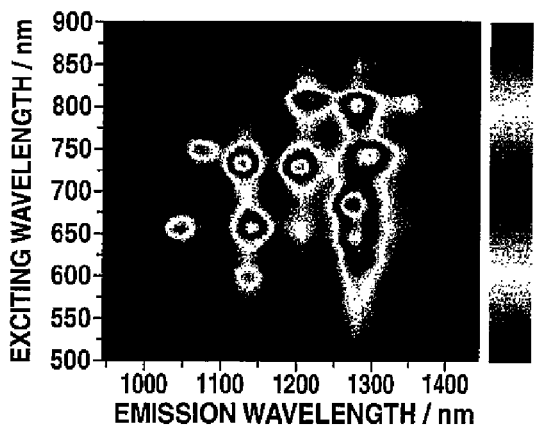
FIG. 3 is a figure showing a near-infrared fluorescence spectrum of a SWCNT-containing dispersion obtained in Example 22.

Further, from the measurement of the near infrared fluorescent spectrum, a fluorescent emission corresponding to the chirality to be observed only for the discretely dispersed semiconducting CNTs was observed, confirming that SWCNTs were discretely dispersed. The resulting near infrared fluorescent spectrum is shown in FIG. 3.

In the same manner as in Example 17, the dispersion was dropped over a PET substrate and applied by means of a bar coater having a slit thickness of 27 µm to obtain a transparent uniform CNT-3/PTPA-PBA-2 thin film composite.

Example 23

Dispersion (2) of CNT-3 by Using PTPA-PBA-2

In the same manner as in Example 17 except that the amount of CNT-3 in Example 22 was changed to 1.0 mg, there was prepared a black transparent SWCNT-containing dispersion, and this dispersion was evaluated. From the measurement of ultraviolet-visible light-infrared absorption spectrum, it was observed that the intensities of absorptions that were found when SWCNTs were discretely dispersed were greater than those of Example 22, confirming that SWCNTs were dispersed to a discrete dispersion state at higher concentration.

Example 24

Dispersion (3) of CNT-3 by Using PTPA-PBA-2
In the same manner as in Example 17 except that the amount of CNT-3 in Example 22 was changed to 2.5 mg, there was prepared a black transparent SWCNT-containing dispersion, and this dispersion was evaluated. From the measurement of ultraviolet-visible light-infrared absorption spectrum, it was observed that the intensities of absorptions that were found when SWCNTs were discretely dispersed were further greater than those of Example 23, confirming that SWCNTs were dispersed to a discrete dispersion state at higher concentration.

Figure 4:
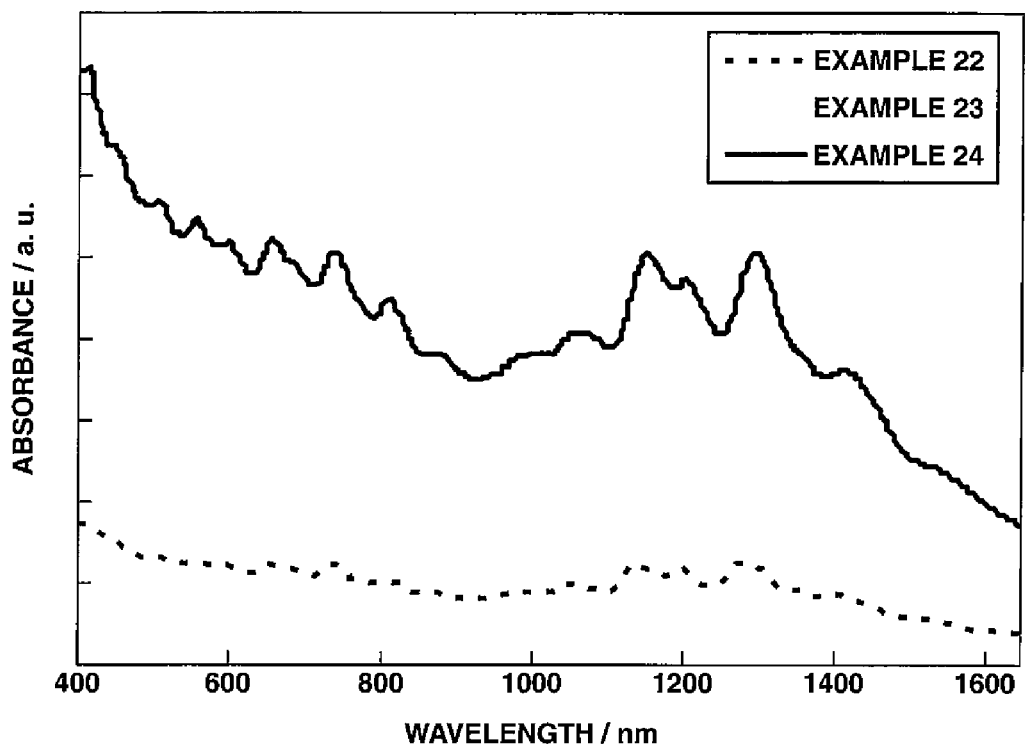
FIG. 4 is a figure showing ultraviolet-visible light-infrared absorption spectrum of SWCNT-containing dispersions obtained in Examples 22 to 24.

It will be noted that the ultraviolet-visible light-infrared absorption spectrum obtained in Examples 22 to 24 are shown in FIG. 4.

Example 25

Dispersion of CNT-2 by Using PTPA-TA
In the same manner as in Example 17 except that the dispersant was changed to PTPA-TA prepared in Example 4, there was prepared a black transparent SWCNT-containing dispersion, and this dispersion was evaluated. From the measurement of ultraviolet-visible light-infrared absorption spectrum, it was observed that the intensities of absorptions that were found when SWCNTs were discretely dispersed were greater than those of Example 17, confirming that SWCNTs were dispersed to a discrete dispersion state at higher concentration.

Example 26

Dispersion of CNT-3 by Using PTPA-TA
In the same manner as in Example 17 except that the dispersant was changed to PTPA-TA prepared in Example 4 and SWCNT was changed to CNT-3, there was prepared a black transparent SWCNT-containing dispersion, and this dispersion was evaluated. From the measurement of ultraviolet-visible light-infrared absorption spectrum, it was observed that the intensities of absorptions that were found when SWCNTs were discretely dispersed were greater than those of Example 18, confirming that SWCNTs were dispersed to a discrete dispersion state at higher concentration.

Example 27

Dispersion of CNT-2 by Using PTPA-TFMBA
In the same manner as in Example 17 except that the dispersant was changed to PTPA-TFMBA prepared in Example 6, there was prepared a black transparent SWCNT-containing dispersion, and this dispersion was evaluated. From the measurement of ultraviolet-visible light-infrared absorption spectrum, it was observed that the intensities of absorptions that were found when SWCNTs were discretely dispersed were greater than those of Example 17, confirming that SWCNTs were dispersed to a discrete dispersion state at higher concentration.

Example 28

Dispersion of CNT-3 by Using PTPA-TFMBA
In the same manner as in Example 17 except that the dispersant was changed to PTPA-TFMBA prepared in Example 6 and SWCNT was changed to CNT-3, there was prepared a black transparent SWCNT-containing dispersion, and this dispersion was evaluated. From the measurement of ultraviolet-visible light-infrared absorption spectrum, it was observed that the intensities of absorptions that were found when SWCNTs were discretely dispersed were greater than those of Example 18, confirming that SWCNTs were dispersed to a discrete dispersion state at higher concentration.

Example 29

Dispersion of CNT-2 by Using PTPA-DPABA
In the same manner as in Example 17 except that the dispersant was changed to PTPA-DPABA prepared in Synthetic Example 3, there was prepared a black transparent SWCNT-containing dispersion, and this dispersion was evaluated. From the measurement of ultraviolet-visible light-infrared absorption spectrum, it was observed that the intensities of absorptions that were found when SWCNTs were discretely dispersed were greater than those of Example 17, confirming that SWCNTs were dispersed to a discrete dispersion state at higher concentration.

Example 30

Dispersion of CNT-3 by Using PTPA-DPABA
In the same manner as in Example 17 except that the dispersant was changed to PTPA-DPABA prepared in Synthetic Example 3 and SWCNT was changed to CNT-3, there was prepared a black transparent SWCNT-containing dispersion, and this dispersion was evaluated. From the measurement of ultraviolet-visible light-infrared absorption spectrum, it was observed that the intensities of absorptions that were found when SWCNTs were discretely dispersed were greater than those of Example 18, confirming that SWCNTs were dispersed to a discrete dispersion state at higher concentration.

Example 31

Dispersion of CNT-2 by Using PTPA-FA
In the same manner as in Example 17 except that the dispersant was changed to PTPA-FA prepared in Synthetic Example 4, there was prepared a black transparent SWCNT-containing dispersion, and this dispersion was evaluated. From the measurement of ultraviolet-visible light-infrared absorption spectrum, the absorptions that were found when SWCNTs were discretely dispersed were clearly observed, confirming that SWCNTs were dispersed to a discrete dispersion state.

Example 32

Dispersion of CNT-3 by Using PTPA-FA
In the same manner as in Example 17 except that the dispersant was changed to PTPA-FA prepared in Synthetic Example 4 and SWCNT was changed to CNT-3, there was prepared a black transparent SWCNT-containing dispersion, and this dispersion was evaluated. From the measurement of ultraviolet-visible light-infrared absorption spectrum, the absorptions that were found when SWCNTs were discretely dispersed were clearly observed, confirming that SWCNTs were dispersed to a discrete dispersion state.

Comparative Example 5

Dispersion of CNT-2 Alone
Such operations as in Example 17 without addition of PTPA-BA-1 as a dispersant were carried out, but SWCNTs could not be dispersed.

Comparative Example 6

Dispersion of CNT-2 by Using PTPA-Br
In the same manner as in Example 17 except that the dispersant was changed to PTPA-Br prepared in Reference 2, there was prepared a black transparent SWCNT-containing dispersion, and this dispersion was evaluated. From the measurement of ultraviolet-visible light-infrared absorption spectrum, the intensities of absorptions that were found when SWCNTs were discretely dispersed were lower than those of Example 17, and thus a difficulty was confirmed in dispersing SWCNTs to a discrete dispersion state at high concentration.

Comparative Example 7

Dispersion of CNT-2 by Using PVP
In the same manner as in Example 17 except that the dispersant was changed to PVP, there was prepared a black transparent SWCNT-containing dispersion, and this dispersion was evaluated. From the measurement of ultraviolet-visible light-infrared absorption spectrum, the intensities of absorptions that were found when SWCNTs were discretely dispersed were much lower than those of Example 17, and thus a difficulty was involved in dispersing SWCNTs to a discrete dispersion state.

Comparative Example 8

Dispersion of CNT-3 by Using PVP
In the same manner as in Example 17 except that the dispersant was changed to PVP and SWCNT was changed to CNT-3, there was prepared a black transparent SWCNT-containing dispersion, and this dispersion was evaluated. From the measurement of ultraviolet-visible light-infrared absorption spectrum, the intensities of absorptions that were found when SWCNTs were discretely dispersed were lower than those of Example 18, and thus a difficulty was involved in dispersing SWCNTs to a discrete dispersion state at high concentration.

[3] Synthesis 2 of Dispersants (Triarylamine-Based Highly Branched Polymer)

Example 33

Synthesis of Highly Branched Polymer PTPA-PBA-3
8.0 g (32.6 mmols) of triphenylamine [made by Zhenjiang Haitong Chemical Industry Co., Ltd.], 11.9 g (65.2 mmols (2.0 equivalents)) of 4-phenylbenzaldehyde [product name of 4-BPAL, made by Mitsubishi Gas Chemical Company, Inc.], 1.2 g (6.5 mmols (0.2 equivalents)) of paratoluenesulfonic acid monohydrate [made by Konan Chemical Manufacturing Co., Ltd.] and 16 g of 1,4-dioxane were charged into a 100 ml four-necked flask under nitrogen. While stirring, the mixture was heated to 85° C. and dissolved to start polymerization. After the reaction for 4 hours and 30 minutes, the reaction mixture was allowed to cool down to 60° C. This reaction mixture was diluted with 40 g of THF and re-precipitated by charging into a mixed solution of 400 g of methanol and 4 g of 28% aqueous ammonia. The settled precipitate was filtered and dried at 130° C. for 6 hours to obtain 14.9 g of intended highly branched polymer PTPA-PBA-3 (hereinafter referred to simply as PTPA-PBA-3).

The weight average molecular weight Mw of the thus obtained PTPA-PBA-3, measured by GPC and calculated as polystyrene, was at 13,000 and the polydispersity Mw/Mn was at 3.39.

Example 34

Synthesis of Highly Branched Polymer PTPA-PBA-4
80.0 g (326 mmols) of triphenylamine [made by Zhenjiang Haitong Chemical Industry Co., Ltd.], 118.9 g (652 mmols (2.0 equivalents)) of 4-phenylbenzaldehyde [product name of 4-BPAL, made by Mitsubishi Gas Chemical Company, Inc.], 12.4 g (65 mmols (0.2 equivalents)) of paratoluenesulfonic acid monohydrate [made by Konan Chemical Manufacturing Co., Ltd.] and 160 g of 1,4-dioxane were charged into a 1 liter four-necked flask under nitrogen. While stirring, the mixture was heated to 85° C. and dissolved to start polymerization. After the reaction for 6 hours, the reaction mixture was allowed to cool down to 60° C. This reaction mixture was diluted with 560 g of THF, to which 80 g of 28% aqueous ammonia was added. The mixed solution was subjected to re-precipitation by charging into 4000 g of methanol. The settled precipitate was filtered and dried under reduced pressure, and the resulting solid was re-dissolved in 640 g of THF and again re-precipitated by charging into 4000 g of methanol. The settled precipitate was filtered and dried at 130° C. for 6 hours to obtain 122.9 g of intended highly branched polymer PTPA-PBA-4 (hereinafter referred to simply as PTPA-PBA-4).

The weight average molecular weight Mw of the thus obtained PTPA-PBA-4, measured by GPC and calculated as polystyrene, was at 19,000 and the polydispersity Mw/Mn was at 4.35.

Example 35

Synthesis of Highly Branched Polymer PTPA-PBA-5
5.0 g (20.4 mmols) of triphenylamine [made by Tokyo Chemical Industry Co., Ltd.], 7.4 g (40.8 mmols (2.0 equivalents)) of 4-phenylbenzaldehyde [made by Tokyo Chemical Industry Co., Ltd.], 1.2 g (6.1 mmols (0.3 equivalents)) of paratoluenesulfonic acid monohydrate [made by Junsei Chemical Co., Ltd.] and 10 g of 1,4-dioxane were charged into a 200 ml four-necked flask under nitrogen. While stirring, the mixture was heated to 100° C. and dissolved to start polymerization. After the reaction for 45 minutes, the reaction mixture was allowed to cool down to 60° C. This reaction mixture was diluted with 100 g of THF and re-precipitated by charging into a mixed solution of 250 g of acetone, 250 g of methanol and 20 g of 28% aqueous ammonia. The settled precipitate was filtered and dried under reduced pressure, and the resulting solid was re-dissolved in 100 g of THF and again re-precipitated by charging into a mixed solution of 250 g of acetone and 250 g of methanol. The settled precipitate was filtered and dried under reduced pressure at 130° C. for 6 hours to obtain 5.7 g of intended highly branched polymer PTPA-PBA-5 (hereinafter referred to simply as PTPA-PBA-5).

The weight average molecular weight Mw of the thus obtained PTPA-PBA-5, measured by GPC and calculated as polystyrene, was at 5,400 and the polydispersity Mw/Mn was at 1.90.

Example 36

Synthesis of Highly Branched Polymer PTPA-PBA-6

80.0 g (326 mmols) of triphenylamine [made by Zhenjiang Haitong Chemical Industry Co., Ltd.], 118.8 g (652 mmols (2.0 equivalents)) of 4-phenylbenzaldehyde [product name of 4-BPAL, made by Mitsubishi Gas Chemical Company, Inc.], 12.4 g (65.2 mmols (0.2 equivalents)) of paratoluenesulfonic acid monohydrate [made by Konan Chemical Manufacturing Co., Ltd.] and 160 g of 1,4-dioxane were charged into a 1 liter four-necked flask under nitrogen. While stirring, the mixture was heated to 85° C. and dissolved to start polymerization. After the reaction for 6 hours, the reaction mixture was allowed to cool down to 60° C. This reaction mixture was diluted with 560 g of THF, to which 80 g of 28% aqueous ammonia was added. This mixed solution was re-precipitated by charging into a mixed solution of 2000 g of acetone and 400 g of water. The settled precipitate was filtered and dried under reduced pressure, and the resulting solid was re-dissolved in 640 g of THF and again re-precipitated by charging into a mixed solution of 2000 g of acetone and 400 g of water. The settled precipitate was filtered and dried at 130° C. for 6 hours to obtain 115.1 g of intended highly branched polymer PTPA-PBA-6 (hereinafter referred to simply as PTPA-PBA-6).

The weight average molecular weight Mw of the thus obtained PTPA-PBA-6, measured by GPC and calculated as polystyrene, was at 17,000 and the polydispersity Mw/Mn was at 3.82.

[4] Preparation 2 of Carbon Nano-Tube-Containing Compositions and Thin Films

Example 37

Dispersion of CNT-1 by Using PTPA-PBA-3

0.50 g of PTPA-PBA-3 prepared in Example 33 as a dispersant was dissolved in 49.25 g of NMP, to which 0.25 g of CNT-1 as MWCNT was added. This mixture was subjected to ultrasonic treatment at room temperature (about 25° C.) for 30 minutes by use of a probe-type ultrasonic irradiation device to obtain a black MWCNT-containing dispersion in which MWCNTs were uniformly dispersed without precipitation.

0.25 g of CHN was added to 1.0 g of the MWCNT-containing dispersion to prepare a thin film-forming composition. 50 μl of the thus obtained composition was uniformly applied over a glass substrate by use of an applicator having a slit thickness of 25.4 μm and dried at 100° C. for 2 minutes to provide a transparent uniform MWCNT/PTPA-PBA-3 thin film composite.

This thin film composite was evaluated with respect to the thin film uniformity, surface resistivity and total light transmittance. It will be noted that the thin film uniformity was evaluated by visual observation based on the following standards. The results of the evaluation are shown in Table 2. Additionally, the MWCNT-containing dispersion was allowed to stand at room temperature (about 25° C.) for 1 month and the presence of a precipitate in the dispersion was confirmed by visual observation, from which the dispersion stability of the dispersion was evaluated based on the following standards. The results of this evaluation are also shown in Table 2.

<Thin Film Uniformity>
○: Neither a lump such as a coagulation nor film unevenness (shading) can be confirmed.
Δ: A coagulation of MWCNT or film unevenness (shading) is observed.
x: A coagulation of MWCNT or film unevenness (shading) is observed almost in all portions of thin film, disabling evaluation as a film.

<Dispersion Stability>
○: No precipitate can be confirmed.
Δ: A precipitate is observed.
x: A dispersion state cannot be held and most of the MWCNT appears as a precipitate.

Example 38

Dispersion of CNT-4 by Using PTPA-PBA-3

In the same manner as in Example 37 except that MWCNT was changed to CNT-4, an MWCNT-containing dispersion was prepared and evaluated. The results of the evaluation are also shown in Table 2.

Example 39

Dispersion of CNT-5 by Using PTPA-PBA-3

In the same manner as in Example 37 except that MWCNT was changed to CNT-5, an MWCNT-containing dispersion was prepared and evaluated. The results of the evaluation are also shown in Table 2.

Example 40

Dispersion of CNT-6 by Using PTPA-PBA-3

In the same manner as in Example 37 except that MWCNT was changed to CNT-6, an MWCNT-containing dispersion was prepared and evaluated. The results of the evaluation are also shown in Table 2.

Example 41

Dispersion of CNT-7 by Using PTPA-PBA-3

In the same manner as in Example 37 except that MWCNT was changed to CNT-7 and the ultrasonic treating time was changed to 60 minutes, an MWCNT-containing dispersion was prepared and evaluated. The results of the evaluation are also shown in Table 2.

Example 42

Dispersion of CNT-8 by Using PTPA-PBA-3

In the same manner as in Example 37 except that MWCNT was changed to CNT-8, an MWCNT-containing dispersion was prepared and evaluated. The results of the evaluation are also shown in Table 2.

Example 43

Dispersion of CNT-9 by Using PTPA-PBA-3

In the same manner as in Example 37 except that MWCNT was changed to CNT-9, an MWCNT-containing dispersion was prepared and evaluated. The results of the evaluation are also shown in Table 2.

Comparative Example 9

Dispersion of CNT-1 by Using PVP

In the same manner as in Example 37 except that the dispersant was changed to PVP and MWCNT was changed to CNT-1, an MWCNT-containing dispersion was prepared and evaluated. The results of the evaluation are also shown in Table 2.

Comparative Example 10

Dispersion of CNT-4 by Using PVP

In the same manner as in Example 37 except that the dispersant was changed to PVP and MWCNT was changed to CNT-4, an MWCNT-containing dispersion was prepared and evaluated. The results of the evaluation are also shown in Table 2.

Comparative Example 11

Dispersion of CNT-5 by Using PVP

In the same manner as in Example 37 except that the dispersant was changed to PVP and MWCNT was changed to CNT-5, an MWCNT-containing dispersion was prepared and evaluated. The results of the evaluation are also shown in Table 2.

Comparative Example 12

Dispersion of CNT-6 by Using PVP

In the same manner as in Example 37 except that the dispersant was changed to PVP and MWCNT was changed to CNT-6, an MWCNT-containing dispersion was prepared and evaluated. The results of the evaluation are also shown in Table 2.

Comparative Example 13

Dispersion of CNT-7 by Using PVP

In the same manner as in Example 37 except that the dispersant was changed to PVP, MWCNT was changed to CNT-7 and the ultrasonic treating time was changed to 60 minutes, an MWCNT-containing dispersion was prepared and evaluated. The results of the evaluation are also shown in Table 2.

Comparative Example 14

Dispersion of CNT-8 by Using PVP

In the same manner as in Example 37 except that the dispersant was changed to PVP and MWCNT was changed to CNT-8, an MWCNT-containing dispersion was prepared and evaluated. The results of the evaluation are also shown in Table 2.

Comparative Example 15

Dispersion of CNT-9 by Using PVP

In the same manner as in Example 37 except that the dispersant was changed to PVP and MWCNT was changed to CNT-9, an MWCNT-containing dispersion was prepared and evaluated. The results of the evaluation are also shown in Table 2.

TABLE 2

| | Dispersant | MWCNT | Dispersion stability | Thin film uniformity | Surface resistivity [$\Omega/\square$] | Total light transmittance [%] |
|---|---|---|---|---|---|---|
| Example 37 | PTPA-PBA-3 | CNT-1 | ○ | ○ | $1.0 \times 10^4$ | 54.7 |
| Example 38 | PTPA-PBA-3 | CNT-4 | ○ | ○ | $3.3 \times 10^5$ | 68.0 |
| Example 39 | PTPA-PBA-3 | CNT-5 | ○ | ○ | $5.6 \times 10^3$ | 54.3 |
| Example 40 | PTPA-PBA-3 | CNT-6 | ○ | ○ | $7.1 \times 10^4$ | 59.0 |
| Example 41 | PTPA-PBA-3 | CNT-7 | ○ | ○ | $6.4 \times 10^3$ | 57.6 |
| Example 42 | PTPA-PBA-3 | CNT-8 | ○ | ○ | $3.1 \times 10^6$ | 63.8 |
| Example 43 | PTPA-PBA-3 | CNT-9 | ○ | ○ | $1.4 \times 10^6$ | 66.9 |
| Comparative Example 9 | PVP | CNT-1 | Δ | Δ-X | ($2.3 \times 10^4$) | (57.7) |
| Comparative Example 10 | PVP | CNT-4 | X | — | — | — |
| Comparative Example 11 | PVP | CNT-5 | ○ | Δ | $3.6 \times 10^4$ | 58.6 |
| Comparative Example 12 | PVP | CNT-6 | ○ | Δ-X | ($3.5 \times 10^4$) | (61.0) |
| Comparative Example 13 | PVP | CNT-7 | ○ | Δ | $2.5 \times 10^4$ | 63.2 |
| Comparative Example 14 | PVP | CNT-8 | ○-Δ | Δ | $>10^8$ | 66.9 |
| Comparative Example 15 | PVP | CNT-9 | ○-Δ | Δ | $>10^8$ | 64.8 |

\* The numeral values in parentheses in the table are reference values because accurate measurement cannot be made owing to the considerable unevenness of film.

As shown in Table 2, a uniform thin film composite can be made by addition of CHN when the thin film is formed. Comparison with PVP that is a known dispersant reveals that as will be pronouncedly noted in the case using CNT-1 (Example 37 and Comparative Example 9) or CNT-6 (Example 40 and Comparative Example 12), the thin films with PVP are non-uniform and cannot be correctly evaluated although the surface resistivities and total light transmittances are shown as reference values, whereas when using the dispersants of the invention, the uniformity of CNT in preparing thin film becomes high, with the result that the surface resistivities stably show a level on the order of $10^4 \Omega/\square$ and the total light transmittances are equal to or greater than comparative counterparts.

When comparing Example 39 and Comparative Example 11 (CNT-5), Example 41 and Comparative Example 13 (CNT-7), Example 42 and Comparative Example 14 (CNT-8) and Example 43 and Comparative Example 15 (CNT-9) wherein the MWCNTs used are of the same type, the surface resistivities of the MWCNT thin film composite making use of the dispersants of the invention were lower by about one to two orders of magnitude than those using PVP that is a known dispersant, along with equal or greater total light transmittances. From these results, it was demonstrated that the dispersants of the invention were advantageous in obtaining uniform thin film composites of high electric conductivity.

Further, for the dispersion of MWCNTs (CNT-4) whose outer diameter is smaller, there could be obtained an MWCNT-containing dispersion in which MWCNTs are uniformly dispersed only when the dispersant of the invention was used, thus enabling a thin film composite to be prepared. When using MWCNT whose outer diameter is small as with CNT-4, it could be expected that the resulting thin film composite had improved transparency. Thus, it was found that the dispersant of the invention was advantageous in respect of the transparency.

From the above results, it has been found that the dispersants of the invention are advantageous in obtaining uniform thin film composites of high electric conductivity and can be widely applicable for dispersion of commercially available MWCNTs.

Example 44

Thermal Curing of CNT-1 Thin Film Composite Using PTPA-PBA-4 and Uril-based Cross-linking Agent 0.50 g of PTPA-PBA-4 prepared in Example 34 as a dispersant was dissolved in 49.25 g of NMP, to which 0.25 g of CNT-1 as MWCNT was added. The resulting mixture was subjected to ultrasonic treatment at room temperature (about 25° C.) for 30 minutes by use of a probe-type ultrasonic irradiation device to obtain a black MWCNT-containing dispersion wherein MWCNTs were uniformly dispersed without precipitation.

0.02 g of 1,3,4,6-tetrakis(methoxymethyl)glycoluril 1 used as a uril-based cross-linking agent, and 0.005 g of pyridinium p-toluenesulfonate as a curing catalyst and 2.5 g of CHN were added to 10.0 g of the MWCNT-containing dispersion to prepare a thin film-forming composition. 50 μl of the thus prepared composition was uniformly applied over a glass substrate by use of an applicator having a slit thickness of 25.4 μm and dried at 100° C. for 2 minutes to provide a black transparent uniform MWCNT/PTPA-PBA-4 thin film composite. This thin film composite was further post-baked at 250° C. for 20 minutes and thus thermally cured.

The resulting thin film composite was evaluated with respect to the surface resistivity, total light transmittance and pencil hardness prior to and after the thermal curing. It will be noted that the pencil hardness was measured according to a hand scratch test described in JIS K5600-5-4. The results of the evaluation are shown in Table 3.

TABLE 3

| | Dispersant | | Surface resistivity [$\Omega/\square$] | Total light transmittance [%] | Pencil hardness |
|---|---|---|---|---|---|
| Example 44 | PTPA-PBA-4 | Prior to curing | $7.4 \times 10^3$ | 41.0 | 5B |
| | | After curing | $6.5 \times 10^3$ | 37.6 | 5H |

The thin film composite obtained in Example 44 is uniform and thus, the dispersibility of the MWCNTs is ensured in case where the thin film composite is prepared by addition of the cross-linking agent and catalyst. Moreover, it has been confirmed that when the thermal curing is carried out by post-baking at a high temperature, the pencil hardness can be remarkably improved. In view of this, it will be clear that the MWCNT thin film composite prepared by use of the dispersant of the invention can be thermally cured by use of an appropriate type of cross-linking agent such as a uril-based cross-linking agent and also by post-baking at high temperature. Thus, the composite can be conveniently used in applications where a hardness and solvent resistance are required for thin film composite.

Example 45

Dispersion of CNT-3 by Using PTPA-PBA-5

2 mg of PTPA-PBA-5 prepared in Example 35 as a dispersant was dissolved in 50 ml of NMP, to which 2 mg of CNT-3 as SWCNT was added. The resulting mixture was subjected to ultrasonic treatment at room temperature (about 25° C.) for 10 minutes by use of a probe-type ultrasonic irradiation device, followed by centrifugal separation at room temperature (about 25° C.) at 10,000 G for 1 hour to collect a black transparent SWCNT-containing dispersion as a supernatant liquid.

Figure 5:
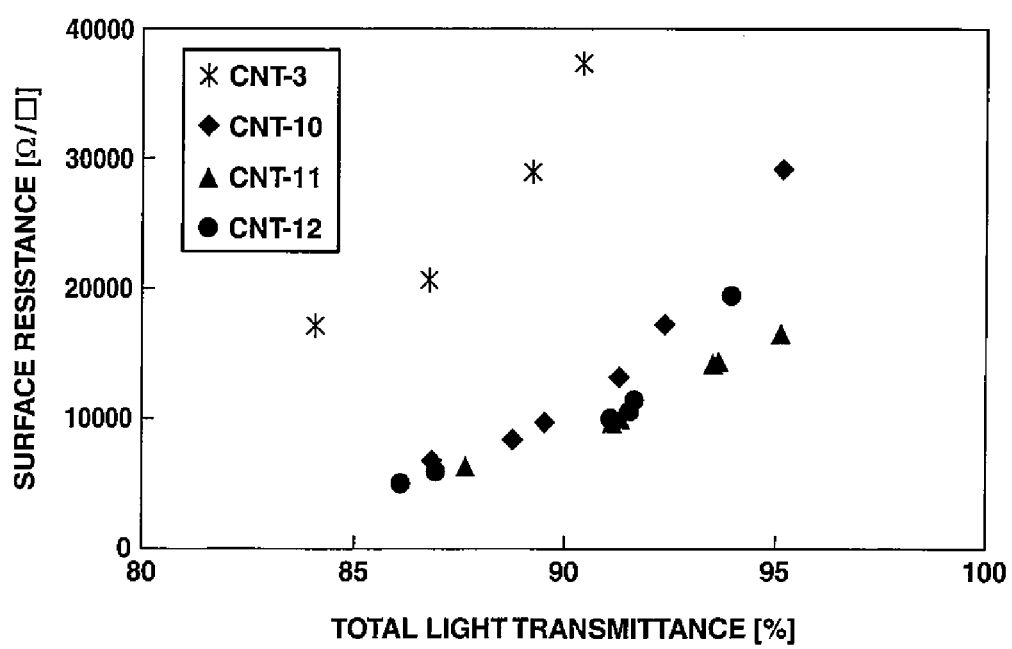
FIG. 5 is a figure showing the relation between the total light transmittance and the surface resistivity of SWCNT thin film composite obtained in Examples 45 to 48.
Figure 6:
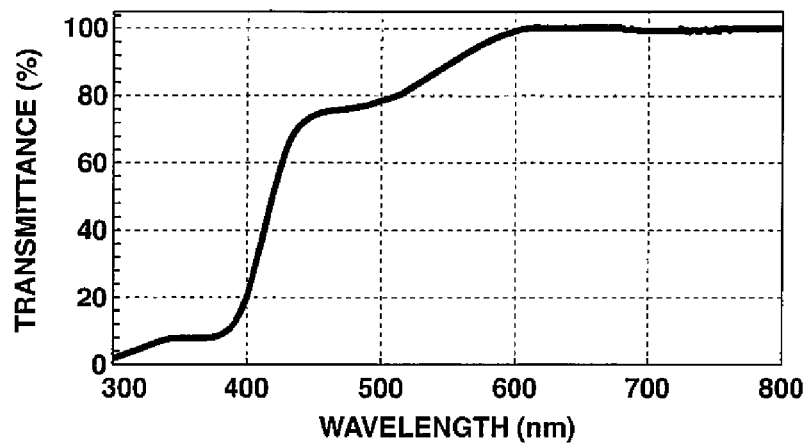
FIG. 6 is a figure showing a light transmittance spectrum of a thin film made in Example 52.
Figure 7:
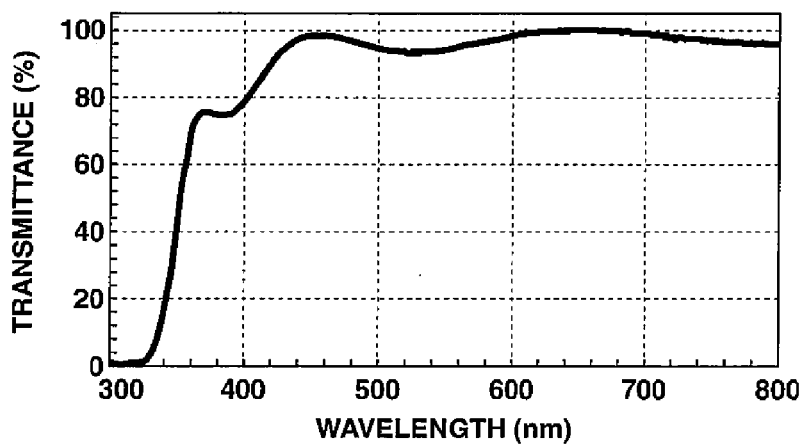
FIG. 7 is a figure showing a light transmittance spectrum of a thin film made in Example 53.
Figure 8:
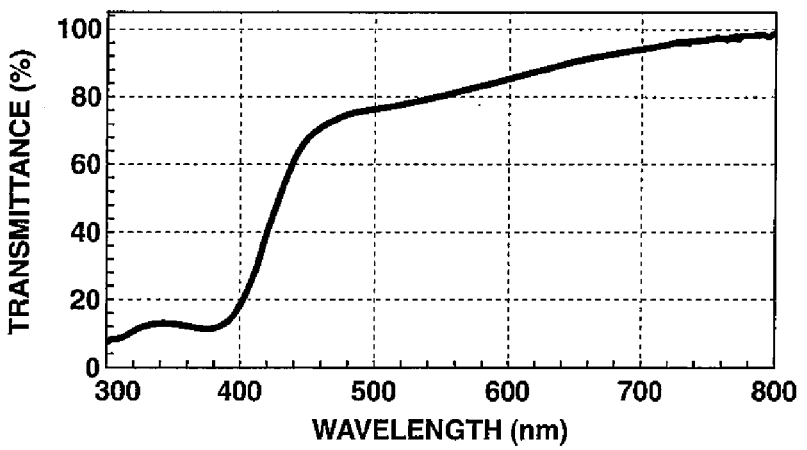
FIG. 8 is a figure showing a light transmittance spectrum of a thin film made in Example 54.
Figure 9:
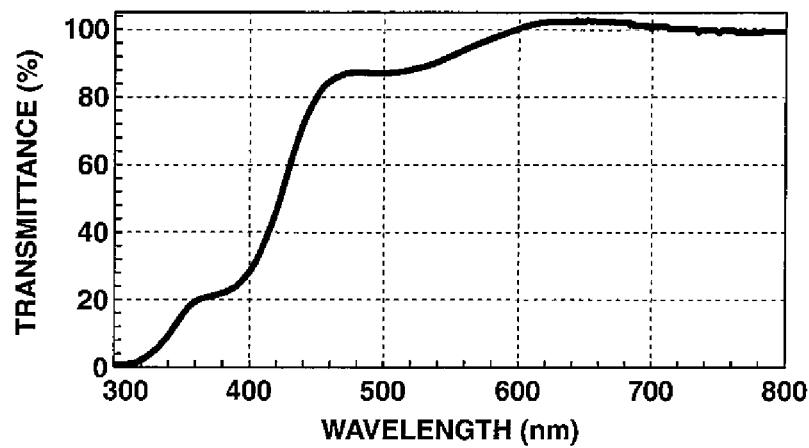
FIG. 9 is a figure showing a light transmittance spectrum of a thin film made in Example 55.
Figure 10:
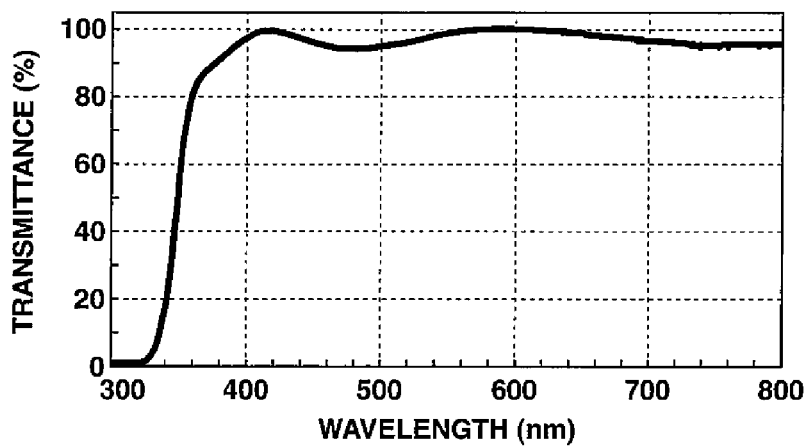
FIG. 10 is a figure showing a light transmittance spectrum of a thin film made in Example 56.
Figure 11:
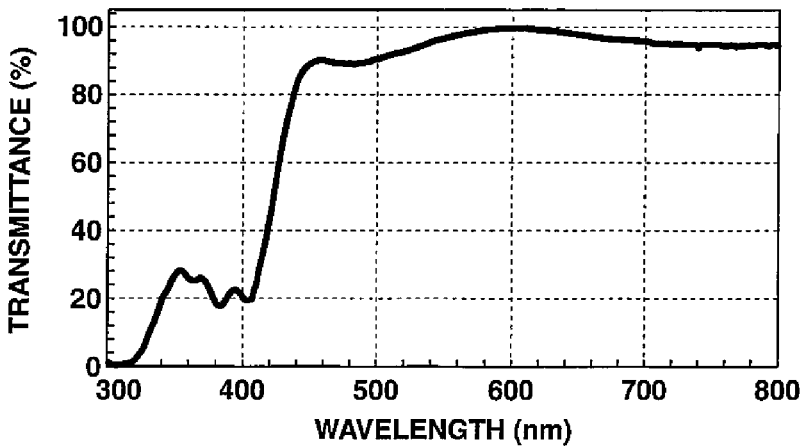
FIG. 11 is a figure showing a light transmittance spectrum of a thin film made in Example 57.
Figure 12:
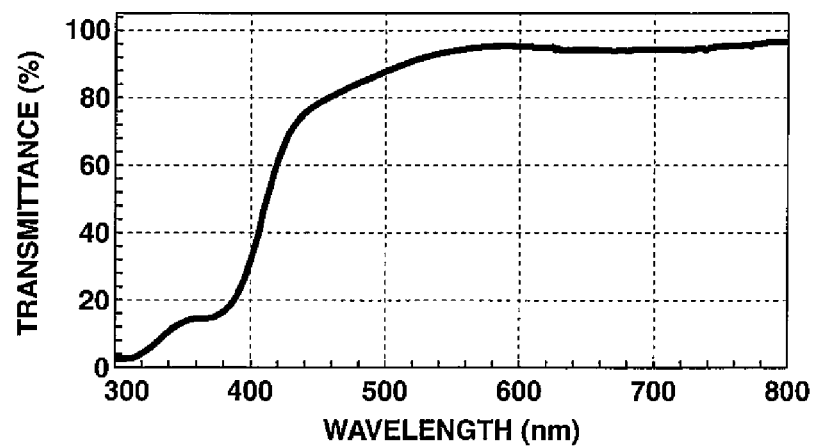
FIG. 12 is a figure showing a light transmittance spectrum of a thin film made in Example 58.

The thus collected black transparent SWCNT-containing dispersion was spray-coated by means of an air brush (nitrogen pressure: 0.2 MPa) over a glass substrate, which was heated with a hot plate kept at 230° C. to provide a uniform SWCNT/PTPA-PBA-5 thin film composite. Additionally, the amount of the SWCNT-containing dispersion to be spray-coated with the air brush was controlled to prepare thin film composites having different thicknesses, and the surface resistivity and total light transmittance of these thin film composites were evaluated. The results of the evaluation are shown in FIG. 5 as a relation of the surface resistivity to the total light transmittance. The surface resistivity of a thin film composite whose total light transmittance is at about 90% is shown in Table 4.

Example 46

Dispersion of CNT-10 by Using PTPA-PBA-5

In the same manner as in Example 45 except that SWCNT was changed to CNT-10, an SWCNT-containing dispersion was prepared and evaluated. The results of the evaluation are also shown in FIG. 5 and Table 4.

Example 47

Dispersion of CNT-11 by Using PTPA-PBA-5

In the same manner as in Example 45 except that SWCNT was changed to CNT-11, an SWCNT-containing dispersion was prepared and evaluated. The results of the evaluation are also shown in FIG. 5 and Table 4.

Example 48

Dispersion of CNT-12 by Using PTPA-PBA-5

In the same manner as in Example 45 except that SWCNT was changed to CNT-12, an SWCNT-containing dispersion was prepared and evaluated. The results of the evaluation are also shown in FIG. 5 and Table 4.

Comparative Example 16

Dispersion of CNT-3 by Using PVP

Such operations as in Example 45 except that the dispersant was changed to PVP were carried out, revealing that the dispersibility of SWCNTs was low and thus, it was difficult to prepare and evaluate a uniform thin film composite.

Comparative Example 17

Dispersion of CNT-10 by Using PVP

Such operations as in Example 45 except that the dispersant was changed to PVP and SWCNT was changed to CNT-10 were carried out, revealing that the dispersibility of SWCNTs was low and thus, it was difficult to prepare and evaluate a uniform thin film composite.

Comparative Example 18

Dispersion of CNT-11 by Using PVP

Such operations as in Example 45 except that the dispersant was changed to PVP and SWCNT was changed to CNT-11 were carried out, revealing that the dispersibility of SWCNTs was low and thus, it was difficult to prepare and evaluate a uniform thin film composite.

Comparative Example 19

Dispersion of CNT-12 by Using PVP

Such operations as in Example 45 except that the dispersant was changed to PVP and SWCNT was changed to CNT-12 were carried out, revealing that the dispersibility of SWCNTs was low and thus, it was difficult to prepare and evaluate a uniform thin film composite.

TABLE 4

|  | Dispersant | SWCNT | Thin film uniformity | Surface resistivity [$\Omega/\square$] | Total light transmittance [%] |
|---|---|---|---|---|---|
| Example 45 | PTPA-PBA-5 | CNT-3 | ○ | $3.7 \times 10^4$ | 90.4 |
| Example 46 | PTPA-PBA-5 | CNT-10 | ○ | $1.3 \times 10^4$ | 91.3 |
| Example 47 | PTPA-PBA-5 | CNT-11 | ○ | $9.6 \times 10^3$ | 91.1 |
| Example 48 | PTPA-PBA-5 | CNT-12 | ○ | $9.9 \times 10^3$ | 91.1 |

When using the dispersant of the invention, not only the dispersion of a variety of commercially available SWCNTs is possible, but also more uniform SWCNT-containing dispersions can be prepared when compared with the case using the known dispersant of PVP. Thin film composites that are excellent in transparency and electric conductivity can be prepared from such dispersions. As shown in FIG. 5, when the amount of an SWCNT-containing dispersion to be spray-coated onto a glass substrate is controlled, there can be prepared thin film composites whose total light transmittance and surface resistivity are controlled within wide ranges, thus being applicable to a wide range of applications.

Further, as shown in Table 4, the surface resistivity of the thin film composites whose total light transmittance is at about 90% is at a level on the order of $10^3$ to $10^4 \Omega/\square$. When comparing thin film composites having a similar level of surface resistivity with one another, there can be obtained a thin film composite whose total light transmittance is higher than with the case making use of MWCNT. From this, when using a dispersant of the invention and SWCNT, it is expected that the resulting thin film composite is improved in transparency, thus being advantageous in obtaining a uniform thin film composite having high electric conductivity and high transparency.

[5] Preparation of a Carbon Nano-Tube-Containing Composition and Molding (Formulated with a Matrix Resin)

Example 49

Composite Formation of CNT-1 and a Thermoplastic Resin by Using PTPA-PBA-6

3.82 g of a polyamide resin ["Genestar PA9MT," made by Kuraray Co., Ltd.] used as a matrix resin, 0.04 g (1 wt % of the total) of CNT-1 used as MWCNT and 0.04 g (1 wt % of the total, CNT:dispersant=1:1) of PTPA-PBA-6 prepared in Example 36 as a dispersant were melt-kneaded by use of a kneader ["Laboplastomill Micro" (kneading mixer capacity: 5 ml), made by Toyo Seiki Seisaku-Sho, Ltd.] at a temperature of 270° C. at a rotation frequency of 50 r.p.m. (effective rotation speed: 150 r.p.m.) for 5 minutes, resulting in composite formation.

The resulting composite was pelletized, filled in a brass mold having a diameter of 2.5 cm and a thickness of about 2 mm and hot pressed at 270° C. to obtain a disk-shaped molding. The surface resistivity of the thus obtained molding was evaluated by means of a high resistivity meter ["Hiresta UP" (used by connection of a URS probe and a regitable), made by Mitsubishi Chemical Corporation] at an applied voltage of 1000V. The results of the evaluation are shown in Table 5.

Comparative Example 20

Composite Formation of CNT-1 and a Thermoplastic Resin without Use of a Dispersant In the same manner as in Example 49 except that the amount of the polyamide resin was changed to 3.86 g and no dispersant was added, a molding was made and evaluated. The results of the evaluation are also shown in Table 5.

TABLE 5

|  | Dispersant | Compositional ratio (by weight) Thermoplastic resin/ CNT-1/dispersant | Surface resistivity [$\Omega/\square$] |
|---|---|---|---|
| Example 49 | PTPA-PBA-6 | 98/1/1 | $5.4 \times 10^{14}$ |
| Comparative Example 20 | nil | 99/1/0 | $>10^{14}$ |

As shown in Table 5, the surface resistivity of the molding made in Example 49 is at a level on the order of $10^{14} \Omega/\square$ revealing that the surface resistivity lowers when compared with the molding made in Comparative Example 20 wherein no dispersant is added. This is considered as follows: the use of the dispersant of the invention permits MWCNT to be more uniformly dispersed in the molten resin during the melt kneading. It is also considered that more uniformly dispersed MWCNTs mutually contact with one another, thus being advantageous in forming an electrically conductive network in the prepared molding. From these results, it has been demonstrated that the use of the dispersant of the invention is advantageous in obtaining a highly conductive resin composite even when the amount of CNT is small.

As set forth above, it will be clearly seen that the use of a dispersant of the invention enables CNT to be stably dispersed at high concentration without an increase in amount of the dispersant and is advantageous in obtaining a thin film composite while suppressing the hindrance of CNT characteristics ascribed to the dispersant. It is evident that when using the dispersant of the invention, CNT can be stably dispersed at high concentration irrespective of the purification treatment of CNT, i.e. the surface state of CNT and the amount of impurities. Thus, the dispersant of the invention is applicable to the dispersion of a wide range of CNTs, compared with a known dispersant of PVP.

From the foregoing, it has been made clear that the dispersant of the invention has a wide range of applications and is advantageous in obtaining uniform dispersions and thin film composites.

[6] Synthesis of Triarylamine-Based Highly Branched Polymers

Example 50

Synthesis of Highly Branched Polymer PTPA-NA 3.0 g (12.2 mmols) of triphenylamine, 2.0 g (12.5 mmols (1.02 equivalents relative to triphenylamine)) of 1-naphthaldehyde [made by Junsei Chemical Co., Ltd.], 0.26 g (1.4 mmols (0.1 equivalent)) of paratoluenesulfonic acid monohydrate [made by Kanto Chemical Co., Inc.] and 3.0 g of 1,4-dioxane were charged into a 100 ml four-necked flask under nitrogen. While stirring, the mixture was heated to 100° C. and dissolved to start polymerization. After the reaction for 2 hours, the reaction mixture was allowed to cool down to 60° C. This reaction mixture was diluted with 20 g of chloroform and re-precipitated by charging into 100 g of methanol. The settled precipitate was filtered and the resulting solid was re-dissolved in 20 g of chloroform, followed by again re-precipitating by charging into 100 g of acetone. The settled precipitate was filtered and dried under reduced pressure at 60° C. for 10 hours to obtain 2.3 g of intended highly branched polymer PTPA-NA (hereinafter referred to simply as PTPA-NA).

The weight average molecular weight Mw, measured by GPC and calculated as polystyrene, of the thus obtained PTPA-NA was at 3,400 and the polydispersity Mw/Mn was at 1.49.

Example 51

Synthesis of Highly Branched Polymer PTPA-AA 5.0 g (20.4 mmols) of triphenylamine, 4.3 g (20.6 mmols (1.01 equivalents)) of 9-anthracene carboxyaldehyde [made by Junsei Chemical Co., Ltd.], 1.5 g (7.6 mmols (0.4 equivalents)) of paratoluenesulfonic acid monohydrate [made by Kanto Chemical Co., Inc.] and 5.0 g of 1,4-dioxane were charged into a 100 ml four-necked flask under nitrogen. While stirring, the mixture was heated to 100° C. and dissolved to start polymerization. After the reaction for 2 hours, the reaction mixture was allowed to cool down to 60° C. This reaction mixture was diluted with 20 g of chloroform and re-precipitated by charging into 200 g of methanol. The settled precipitate was filtered and the resulting solid was re-dissolved in 20 g of chloroform, followed by again re-precipitating by charging into 200 g of acetone. The settled precipitate was filtered and dried under reduced pressure at 60° C. for 10 hours to obtain 4.1 g of intended highly branched polymer PTPA-AA (hereinafter referred to simply as DTPA-AA).

The weight average molecular weight Mw, measured by GPC and calculated as polystyrene, of the thus obtained PTPA-AA was at 2,900 and the polydispersity Mw/Mn was at 1.31.

Synthetic Example 5

Synthesis of Highly Branched Polymer PTPA-BA-3

10.0 g (40.8 mmols) of triphenylamine, 6.5 g (61.4 mmols (1.52 equivalents)) of benzaldehyde [made by Junsei Chemical Co., Ltd., herein and whenever it appears hereinafter], 0.81 g (4.3 mmols (0.1 equivalent)) of paratoluenesulfonic acid monohydrate [made by Kanto Chemical Co., Inc.] and 10 g of 1,4-dioxane were charged into a 100 ml four-necked flask under nitrogen. While stirring, the mixture was heated to 100° C. and dissolved to start polymerization. After the reaction for 2 hours, the reaction mixture was allowed to cool down to 60° C. This reaction mixture was diluted with 30 g of chloroform and re-precipitated by charging into 300 g of methanol. The settled precipitate was filtered and the resulting solid was re-dissolved in 30 g of chloroform, followed by again re-precipitating by charging into 300 g of acetone. The settled precipitate was filtered and dried under reduced pressure at 60° C. for 10 hours to obtain 8.7 g of intended highly branched polymer PTPA-BA-3 (hereinafter referred to simply as PTPA-BA-3).

The weight average molecular weight Mw, measured by GPC and calculated as polystyrene, of the thus obtained PTPA-BA-3 was at 7,800 and the polydispersity Mw/Mn was at 2.10.

Reference 3

Synthesis of Linear Polymer PDPA-BA-2

2.0 g (11.8 mmols) of diphenylamine [made by Tokyo Chemical Industry Co., Ltd.], 1.3 g (11.9 mmols (1.01 equivalents)) of benzaldehyde, 0.25 g (1.3 mmols (0.1 equivalent)) of paratoluenesulfonic acid monohydrate [made by Kanto Chemical Co., Inc.] and 4.0 g of 1,4-dioxane were charged into a 100 ml four-necked flask under nitrogen. While stirring, the mixture was heated to 100° C. and dissolved to start polymerization. After the reaction for 45 minutes, the reaction mixture was allowed to cool down to 60° C. This reaction mixture was diluted with 20 g of chloroform and re-precipitated by charging into 100 g of methanol. The settled precipitate was filtered and the resulting solid was re-dissolved in 8 g of chloroform, followed by again re-precipitating by charging into 100 g of methanol. The settled precipitate was filtered and dried under reduced pressure at 60° C. for 10 hours to obtain 2.3 g of intended linear polymer PDPA-BA-2 (hereinafter referred to simply as PDPA-BA-2).

The weight average molecular weight Mw, measured by GPC and calculated as polystyrene, of the thus obtained PDPA-BA-2 was at 9,900 and the polydispersity Mw/Mn was at 2.47.

Thermal Analyses of the Respective Polymers

The respective polymers obtained in Examples 1, 2, 4, 5, 50, 51, Synthetic Example 5 and Reference 3 were subjected to measurement of a glass transition temperature (Tg) by DSC and also a 5% weight loss temperature ($Td_{5\%}$) by TG-DTA. The results are shown in Table 6.

[7] Preparation of film-forming compositions and thin films

Examples 52 to 58

Preparation and Characteristic Evaluation of Highly Branched Polymer Thin Films 1.0 g of the highly branched polymers obtained in Examples 1, 2, 4, 5, 50, 51 and Synthetic Example 5 were, respectively, dissolved in 9.0 g of CHN to obtain varnishes having 10 wt % of the respective highly branched polymers in the form of a light yellow transparent solution.

The thus obtained varnishes were coated onto a glass substrate by use of a spin coater in a film thickness of about 300 nm. The thus coated films were baked with a hot plate of 100° C. for 1 minute and subsequently at 250° C. for 5 minutes to obtain the thin films of the respective highly branched polymers.

The thin films were, respectively, subjected to measurement of a refractive index at 550 nm and 633 nm by means of an ellipsometer and a thickness thereof. The results are also shown in Table 6. The light transmission spectra of the thin films are shown in FIGS. 6 to 12.

Additionally, the varnishes were allowed to stand at a temperature of 23° C. at a relative humidity of 55 RH % for 1 month and were visually observed. It was revealed that these varnishes were excellent in storage stability without precipitation in all the highly branched polymers.

Comparative Example 21

Preparation and Characteristic Evaluation of Linear Polymer Thin Film

Figure 13:
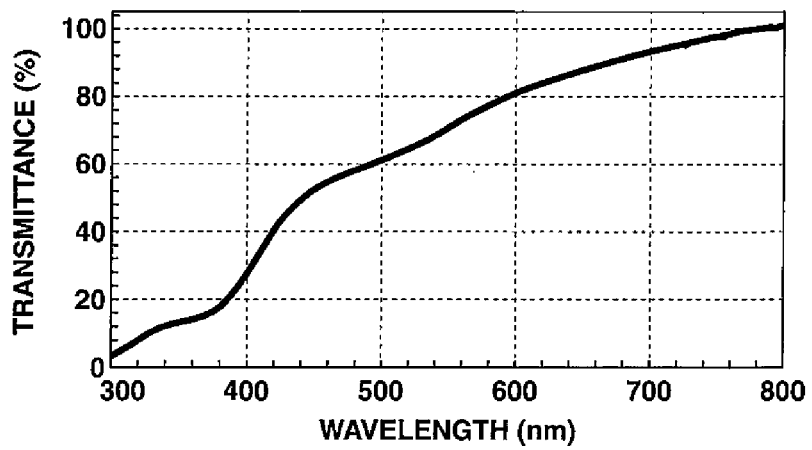
FIG. 13 is a figure showing a light transmittance spectrum of a thin film made in Comparative Example 21.

A thin film was prepared and evaluated in the same manner as in Example 52 using PDPA-BA-2 obtained in Reference 3. The results are shown in Table 6. The light transmission spectrum is shown in FIG. 13.

TABLE 6

| | Polymer | Mw | Mw/Mn | Tg [° C.] | $Td_{5\%}$ [° C.] | Refractive index 550 nm | Refractive index 633 nm | Film thickness [nm] |
|---|---|---|---|---|---|---|---|---|
| Example 52 | PTPA-pAA | 42,000 | 5.83 | 169 | 401 | 1.745 | 1.720 | 339 |
| Example 53 | PTPA-PBA-1 | 13,000 | 2.93 | 191 | 531 | 1.729 | 1.709 | 377 |
| Example 54 | PTPA-TA | 77,000 | 11.25 | 155 | 458 | 1.768 | 1.743 | 271 |
| Example 55 | PTPA-TPA | 45,000 | 7.10 | 190 | 449 | 1.743 | 1.720 | 369 |
| Example 56 | PTPA-NA | 3,400 | 1.49 | 191 | 449 | 1.720 | 1.702 | 345 |
| Example 57 | PTPA-AA | 2,900 | 1.31 | 202 | 414 | 1.776 | 1.747 | 306 |
| Example 58 | PTPA-BA-3 | 7,800 | 2.10 | 170 | 551 | 1.736 | 1.713 | 305 |
| Comparative Example 21 | PDPA-BA-2 | 9,900 | 2.47 | 128 | 337 | 1.798 | 1.775 | 277 |

As shown in Table 6, the $Td_{5\%}$ values of the respective highly branched polymers are at 401 to 551° C., confirming that they are much more excellent in heat resistance than the linear polymer (PDPA-BA-2) whose value is at 337° C. The thin films made of the respective highly branched polymers have a refractive index that is in the range of 1.720 to 1.776 at a wavelength of 550 nm and 1.702 to 1.747 at a wavelength of 633 nm, thus being very high in refractive index.

As shown in FIGS. 6 to 13, it has been confirmed that the thin films obtained in Examples 52 to 58 are higher in transmittance in the visible light range of 400 to 800 nm than the thin film obtained in Comparative Example 21, thus having high transparency.

As described hereinabove, the highly branched polymers of the invention are excellent in transparency and heat resistance, have a high refractive index and are excellent in solubility in a variety of solvents and are thus applicable to as a protective film of liquid crystal display devices, a TFT array flattening film, an overcoat such as of a color filter and the like, a spacer material, a light retrieval efficiency-improving film of EL displays, a light taking-in efficiency improving layer of image pickup devices and a light capture efficiency-improving layer of LED devices, and the like.

The invention claimed is:

1. A method for dispersing a carbon nano-tube, comprising:
   dispersing said carbon-nano tube in a carbon nano-tube dispersant, said dispersant comprising a highly branched polymer obtained by condensation polymerization of a triarylamine compound, and an aldehyde compound and/or a ketone compound in the presence of an acid catalyst.

2. The method for dispersing a carbon nano-tube according to claim 1, wherein said carbon nano-tube has a weight average molecular weight, measured by gel permeation chromatography and calculated as polystyrene, of said highly branched polymer is at 1,000 to 2,000,000.

3. The method for dispersing a carbon nano-tube according to claim 2, wherein said highly branched polymer has repeating units represented by the formula (1) or (2)

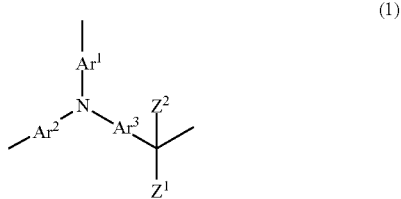

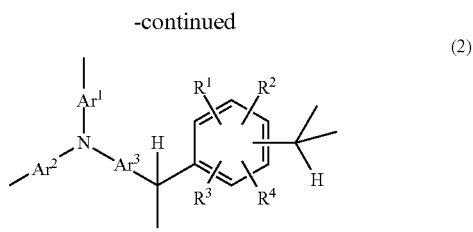

wherein, in formula (1) or (2), $Ar^1$ to $Ar^3$ respectively independently represent any of divalent organic groups represented by the formulas (3) to (7), $Z^1$ and $Z^2$ respectively independently represent a hydrogen atom, an alkyl group that may have a branched structure having 1 to 5 carbon atoms, or any of monovalent organic groups represented by the formulas (8) to (11), that $Z^1$ and $Z^2$ do not stand for the above-defined alkyl group at the same time, and in the formula (2), $R^1$ to $R^4$ respectively independently represent a hydrogen atom, a halogen atom, an alkyl group that may have a branched structure having 1 to 5 carbon atoms or an alkoxy group that may have a branched structure having 1 to 5 carbon atoms,

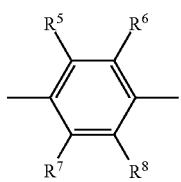

(3)

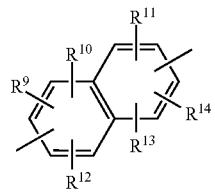

(4)

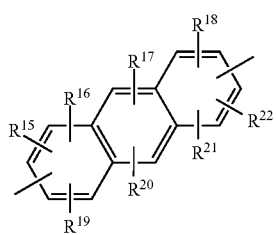

(5)

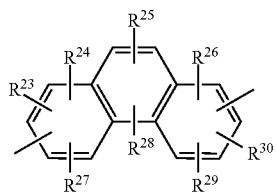

(6)

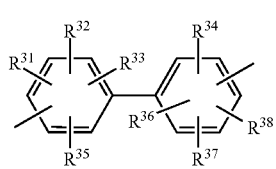

(7)

wherein $R^5$ to $R^{38}$ respectively independently represent a hydrogen atom, a halogen atom, an alkyl group that may have a branched structure having 1 to 5 carbon atoms, or an alkoxy group that may have a branched structure having 1 to 5 carbon atoms,

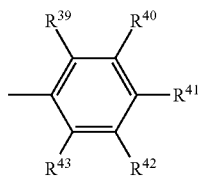

(8)

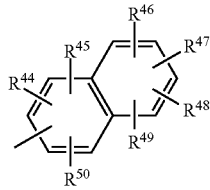

(9)

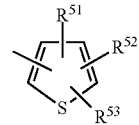

(10)

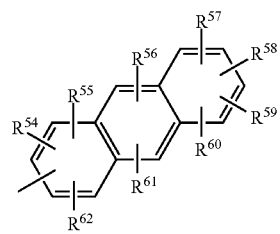

(11)

wherein $R^{39}$ to $R^{62}$ respectively independently represent a hydrogen atom, a halogen atom, an alkyl group that may have a branched structure having 1 to 5 carbon atoms, a haloalkyl group that may have a branched structure having 1 to 5 carbon atoms, a phenyl group, $OR^{63}$, $COR^{63}$, $COOR^{63}$ or $NR^{63}R^{64}$, wherein $R^{63}$ and $R^{64}$ respectively independently represent a hydrogen atom, an alkyl group that may have a branched structure having 1 to 5carbon atoms, a haloalkyl group that may have a branched structure having 1 to 5 carbon atoms, or a phenyl group.

4. The method for dispersing a carbon nano-tube according to claim 3, wherein the repeating units are represented by the formula (12)

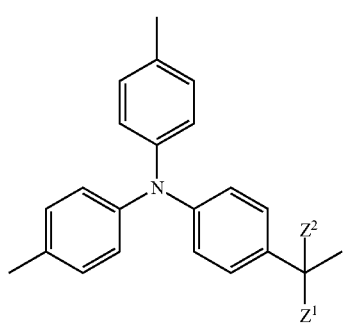

(12)

wherein $Z^1$ and $Z^2$, respectively, have the same meanings as defined above.

5. The method for dispersing a carbon nano-tube according to claim 3, wherein $Z^2$ is a hydrogen atom.

6. The method for dispersing a carbon nano-tube according to claim 5, wherein $Z^1$ is a hydrogen atom, a thienyl group or a monovalent organic group represented by the formula (8')

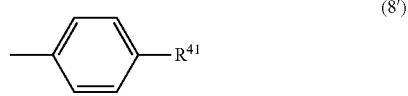

(8')

wherein $R^{41}$ represents a hydrogen atom, a halogen atom, an alkyl group that may have a branched structure having 1 to 5 carbon atoms, a haloalkyl group that may have a branched structure having 1 to 5 carbon atoms, a phenyl group, $OR^{63}$ or $NR^{63}R^{64}$, wherein $R^{63}$ and $R^{64}$, respectively, have the same meanings as defined above.

7. The method for dispersing a carbon nano-tube according to claim 3, wherein the repeating units are represented by the following formula (13)

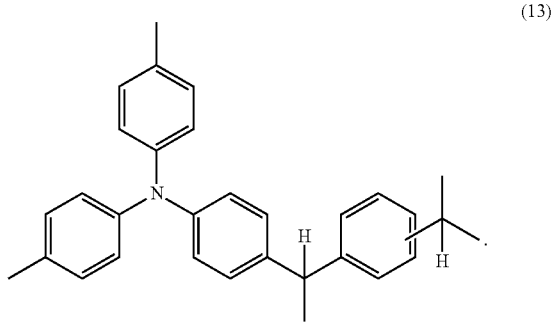

(13)

8. A composition comprising:
a carbon nano-tube dispersant, comprising a highly branched polymer obtained by condensation polymerization of a triarylamine compound, and an aldehyde compound and/or a ketone compound in the presence of an acid catalyst; and carbon nano-tubes.

9. The composition as defined in claim 8, wherein said carbon nano-tube dispersant is adhered to the surface of the carbon nano-tubes to form composites.

10. The composition as defined in claim 8, further comprising an organic solvent.

11. The composition as defined in claim 10, wherein said carbon nano-tubes are discretely dispersed in said organic solvent.

12. The composition as defined in claim 10, wherein said composite is discretely dispersed in said organic solvent.

13. The composition as defined in claim 8, wherein said carbon nano-tubes are at least one selected from a single-walled carbon nano-tube, a double-walled carbon nano-tube and a multi-walled carbon nano-tube.

14. The composition as defined in claim 10, further comprising a cross-linking agent soluble in the organic solvent.

15. The composition as defined in claim 14, further comprising an acid and/or an acid generator.

16. A thin film obtained from the composition as defined in claim 8.

17. A cured film obtained by subjecting the thin film obtained from the composition as defined in claim 14 to thermal treatment.

18. The composition as defined in claim 8, further comprising a resin serving as a matrix.

19. The composition as defined in claim 18, wherein the resin serving as the matrix is a thermoplastic resin.

20. The composition as defined in claim 18, wherein said carbon nano-tube is at least one selected from a single-walled carbon nano-tube, a double-walled carbon nano-tube and a multi-walled carbon nano-tube.

21. A method for preparing a composition, characterized by comprising the steps of mixing the composition of claim 8 and an organic solvent to prepare a mixture, and subjecting the mixture to mechanical treatment.

22. The preparing method as defined in claim 21, characterized by comprising the steps of adding the carbon nano-tubes to a solution dissolving the carbon nano-tube dispersant in the organic solvent to prepare the mixture, and subjecting the mixture to mechanical treatment.

23. A method for preparing a composition, characterized by comprising the step of melt-kneading the composition of claim 8 and a thermoplastic resin to provide a composite.

* * * * *